(12) United States Patent
Matsumoto et al.

(10) Patent No.: US 12,738,817 B2
(45) Date of Patent: Sep. 15, 2026

(54) ELECTRIC WORK VEHICLE HAVING AN INVERTER HOUSING

(71) Applicant: KUBOTA CORPORATION, Osaka (JP)

(72) Inventors: Ryunosuke Matsumoto, Sakai (JP); Kazuto Okazaki, Sakai (JP); Shinichi Kawabata, Sakai (JP)

(73) Assignee: KUBOTA CORPORATION, Osaka (JP)

( * ) Notice: Subject to any disclaimer, the term of this patent is extended or adjusted under 35 U.S.C. 154(b) by 197 days.

(21) Appl. No.: 18/667,280

(22) Filed: May 17, 2024

(65) Prior Publication Data

US 2024/0305172 A1 Sep. 12, 2024

Related U.S. Application Data

(63) Continuation of application No. PCT/JP2022/042000, filed on Nov. 10, 2022.

(30) Foreign Application Priority Data

Dec. 24, 2021 (JP) ................................ 2021-211636
Dec. 24, 2021 (JP) ................................ 2021-211637

(51) Int. Cl.
*H02K 11/33* (2016.01)
*B60L 15/00* (2006.01)
(Continued)

(52) U.S. Cl.
CPC ............ *H02K 11/33* (2016.01); *B60L 15/007* (2013.01); *B60L 50/60* (2019.02); *H05K 7/1432* (2013.01);
(Continued)

(58) Field of Classification Search
CPC ..... A01D 36/02; A01D 2101/00; B60L 50/60; B60L 15/007; H02K 11/33; H05K 7/1432
(Continued)

(56) References Cited

U.S. PATENT DOCUMENTS 12,068,496 B2 * 8/2024 Uemura ............. H01M 50/284
2015/0114955 A1 4/2015 Inaba et al.
(Continued)

FOREIGN PATENT DOCUMENTS

CN 203504423 U 3/2014
JP H11122875 A 4/1999
(Continued)

OTHER PUBLICATIONS

Official Communication issued in International Patent Application No. PCT/JP2022/042000, mailed on Jan. 17, 2023.
(Continued)

*Primary Examiner* — Rashad H Johnson
(74) *Attorney, Agent, or Firm* — Keating & Bennett, LLP

(57) ABSTRACT

An inverter includes an exterior case housing a substrate provided with an inverter circuit. The exterior case includes a rectangular box-shaped case body with an opening above a space surrounded by a bottom plate portion and a peripheral wall portion of the case body, and a case lid operable to open and close the opening. Substrate stopping portions to fix the substrate are provided on an upper surface of the bottom plate portion. Also, reinforcing ribs are provided on an outer surface of the peripheral wall portion of the case body and on an inner surface of the case lid.

13 Claims, 15 Drawing Sheets

(51) Int. Cl.

| | |
|---|---|
| ***B60L 50/60*** | (2019.01) |
| ***H05K 7/14*** | (2006.01) |
| *A01D 69/02* | (2006.01) |
| *A01D 101/00* | (2006.01) |

(52) U.S. Cl.
CPC .......... *A01D 69/02* (2013.01); *A01D 2101/00* (2013.01); *B60L 2200/40* (2013.01)

(58) Field of Classification Search
USPC ........................................................ 310/68 D
See application file for complete search history.

(56) References Cited

U.S. PATENT DOCUMENTS

| | | | | |
|---|---|---|---|---|
| 2015/0314692 | A1* | 11/2015 | Inoue | H01M 50/262 318/139 |
| 2015/0329175 | A1* | 11/2015 | Inoue | B60K 1/04 307/10.1 |
| 2018/0343737 | A1* | 11/2018 | Morimoto | H05K 1/0271 |
| 2021/0068341 | A1 | 3/2021 | Matsuda et al. | |
| 2022/0234434 | A1* | 7/2022 | Tottori | B60L 58/26 |
| 2024/0305172 | A1* | 9/2024 | Matsumoto | H02K 11/33 |
| 2025/0135876 | A1* | 5/2025 | Graf | B60K 1/02 |
| 2025/0135914 | A1* | 5/2025 | Nadiadi | B60L 50/64 |
| 2025/0135919 | A1* | 5/2025 | Wright | B60L 58/26 |
| 2025/0135956 | A1* | 5/2025 | Bodepudi | H01M 10/6566 |
| 2025/0135957 | A1* | 5/2025 | Wright | H01M 10/613 |
| 2025/0136026 | A1* | 5/2025 | Nadiadi | H01M 50/51 |
| 2025/0140974 | A1* | 5/2025 | Anattasakul | B60L 50/66 |
| 2025/0140983 | A1* | 5/2025 | Wright | H01M 10/6563 |
| 2025/0141013 | A1* | 5/2025 | Nadiadi | H01M 50/514 |

FOREIGN PATENT DOCUMENTS

| | | | |
|---|---|---|---|
| JP | 2003-069275 | A | 3/2003 |
| JP | 2021-000953 | A | 1/2021 |
| WO | 2013/175651 | A1 | 11/2013 |

OTHER PUBLICATIONS

Official Communication issued in corresponding European Patent Application No. 22910655.4 mailed on Dec. 8, 2025, 14 pages.

* cited by examiner 30
31
3
32
11
16
15
19
M
Q
4
12
2
10
B
U
D
F

B
U
D
F
18
16
17
11
15a
15
15b
19
M
4
14
10

4
M
16
22
21B
23
24A
24
14
21
2B(2)
13
24A
14C
21A
20
20A
10F
2A(2)
B
U
D
F

CL
4
25
24
24B
24A
24C
26
27
23
5A
(5)
20A
28
2A(2)
5B(5)
57
21
14C
20
2B(2)
14
U
L
D
R 58c
58d
XII
24A
24Ca
26
57
24C
XIII
58
(5B)
20
23
2A(2)
B
R
L
F 55d
55c
55c
6
55a
61
54
54
54
53
53
55a(56)
53
55d
55a
60A(60)
55c
55c
55d
60B(60)
55
62
55c
55a(56)
55d
14B
B
R
L
F
20
21A 58c
55R
55a
(56)
57
55c
55c
55c
55b
(56)
55
5B(5)
58c
5A(5)
B
U
D
F 50d
50e
50e
50e
50a (56)
50a (56)
50c
50c
50d
50e
50e
50e
50b (56)
50d
50b (56)
50d
B
L
R
F 58c
58a (8a)
58a (8a)
58a (8a)
58a (8a)
8
59a
59b
59b
59a
59c
59c
S1
58(5B)
58b
58c
B
L
R
F 55a (56)
58b
55d
55c
53(52)
55c
55
57
50d
53 (51)
60A(60)
50b
60B(60)
50a
d3
50c
d2
62(52)
56
5A(5)
5B(5)
50c
59c
50a
59c
57
50d
58b
55d
55
L
U
D
R

ELECTRIC WORK VEHICLE HAVING AN INVERTER HOUSING

CROSS REFERENCE TO RELATED APPLICATIONS

This application claims the benefit of priority to Japanese Patent Application No. 2021-211636 and 2021-211637 filed on Dec. 24, 2021 and is a Continuation application of PCT Application No. PCT/JP2022/042000 filed on Nov. 10, 2022. The entire contents of each application are hereby incorporated herein by reference.

BACKGROUND OF THE INVENTION

1. Field of the Invention

The present invention relates to electric work vehicles each including a battery, motors driven by electric power supplied from the batteries, and travel devices driven by the motors.

2. Description of the Related Art

An electric work vehicle such as described above has already been disclosed in JP 2021-953A, for example. This electric work vehicle ("tractor" in JP 2021-953A) has an inverter on the power supply path from the battery to the electric motor.

SUMMARY OF THE INVENTION

The electric work vehicle having the structure shown in JP 2021-953A has a reasonably sturdy support structure in which a large inverter support portion that is supported by left and right body frames is integrally formed with a relatively sturdy battery support base for supporting a large battery. Attaching the inverter to the inverter support portion serving as a sturdy support structure allows transmission of shaking, vibration and the like to the inverter to be suppressed as much as possible.

However, in an electric work vehicle that performs various tasks, various shaking, vibration and the like may be transmitted to the inverter due to a variety of external factors, such as vibration from the hydrostatic continuously variable transmission, vibration from the various work devices that are used, and shaking, vibration and the like that occur when traveling on uneven ground. Thus, there is room for improvement in terms of the difficulty in avoiding shaking, vibration and the like transmitted to the inverter simply by improving the support strength of the location where the inverter is installed.

Example embodiments of the present invention aim to reduce the effects of shaking, vibration and the like transmitted to an inverter by providing the inverter itself with a vibration resistance function.

Also, JP 2021-953A merely shows the inverter as a box-shaped body, and the specific structure thereof is not disclosed.

When the inverter has a structure that merely combines a box-shaped body and a lid body, with an inverter circuit housed in the box-shaped body being accessed for maintenance purposes by opening the lid body, the region of the case body where the case lid opens and closes is required to be firmly sealed, so as to reliably avoid ingress of dust, rainwater, and the like from outside through this region. Furthermore, measures are also needed to avoid degradation of the sealing properties due to deterioration of the seal over time, and there is room for improvement in terms of the risk of adding complexity to the structure and making the opening/closing operation more troublesome.

Example embodiments of the present invention further provide electric work vehicles in each of which ingress of dust, rainwater, and the like through a region where an exterior case used as an inverter opens and closes is readily reliably avoided with a simple structure.

An electric work vehicle according to an example embodiment of the present invention includes a battery, an electric motor to receive electric power from the battery, an inverter on a power supply path from the battery to the electric motor, and a travel device to be driven by the electric motor, the inverter including an exterior case housing a substrate provided with an inverter circuit, the exterior case including a rectangular or substantially rectangular box-shaped case body provided with an opening above a space surrounded by a bottom plate portion and a peripheral wall portion of the case body, and a case lid operable to open and close the opening, the bottom plate portion being provided on an upper surface thereof, with a substrate stopping portion to fix the substrate, and the case body being provided with at least one reinforcing rib on an outer surface of the peripheral wall portion, and the case lid being provided with at least one reinforcing rib on an inner surface thereof.

According to an example embodiment of the present invention, a rigidity of the exterior case housing the substrate provided with the inverter circuit is enhanced by providing a reinforcing rib on the outer surface of the peripheral wall portion of the case body and on the inner surface of the case lid. A reduction in shaking, vibration and the like transmitted to the inverter can thereby be achieved.

Furthermore, the reinforcing rib provided on the exterior case is advantageous in terms of being able to enhance the heat dissipation effect obtained through contact with the outside air, as a result of being defined by the outer surface of the peripheral wall portion of the case body. Also, the reinforcing rib provided on the inner surface of the case lid helps strengthen the exterior case as a whole, while accumulation of dust is readily avoided and installation of the exterior case in the narrow space between the vehicle body frame and the battery installation base is facilitated, as a result of a reinforcing rib that protrudes upward not being provided on the upper surface of the case lid.

In an example embodiment of the present invention, preferably the at least one reinforcing rib on the peripheral wall portion is at least one vertical rib extending in an up-down direction, and the at least one reinforcing rib on the inner surface of the case lid is at least one diagonal grid-shaped rib extending in a diagonal direction of the case lid.

According to this configuration, high vertical and horizontal strength is readily maintained through the combined use of a vertical rib extending in the up-down direction on the peripheral wall portion and a diagonal grid-shaped rib extending in the diagonal direction of the case lid on the inner surface of the case lid.

In an example embodiment of the present invention, preferably the at least one vertical rib does not protrude outside an outer peripheral edge of an upper end of the peripheral wall portion, and the peripheral wall portion includes an outer wall surface between the vertical ribs positioned adjacent to each other that is a recessed wall surface that is recessed to approach closer to an inner wall surface of the case body than a location of the vertical ribs.

According to this configuration, the high vertical strength of the exterior case is maintained as a result of the vertical ribs, while securing a large surface area of the peripheral wall portion as a result of the outer wall surface located between the vertical ribs being defined by a recessed wall surface that is recessed to approach the inner wall surface of the case body. Heat is thereby readily efficiently dissipated, and weight reduction is readily achieved at the same time.

In an example embodiment of the present invention, preferably the at least one vertical rib overlaps, in a side view, with a screw hole in the peripheral wall portion to fasten the case lid to the case body.

According to this configuration, as a result of the screw holes being provided in portions of the peripheral wall portion where the vertical ribs are provided, which portions are high-strength portions, the coupling strength between the case body and the case lid when fastened together is readily maintained high.

In an example embodiment of the present invention, preferably the at least one diagonal grid-shaped rib extends in a direction joining coupling holes for bolt insertion in a rectangular or substantially rectangular peripheral portion of the case lid.

According to this configuration, as a result of the diagonal grid-shaped rib on the case lid extending in a direction that joins coupling holes for bolt insertion, the diagonal grid-shaped rib acts like a brace while the case body and the case lid are fastened together, and the strength of the exterior case as a whole is readily enhanced.

In an example embodiment of the present invention, preferably the inner surface of the case lid includes a region in which a portion of the at least one diagonal grid-shaped rib protruding into the space does not exist, and a space between the case lid and a component attached to the case body at a location facing the region is provided to define an insulation distance.

According to this configuration, when the exterior case includes a conductor, the provision of a region in which a portion of the diagonal grid-shaped rib protruding into the inner space of the case does not exist provides a space to define an insulation distance between that region and a component facing that region.

In an example embodiment of the present invention, preferably the bottom plate portion is provided, on a lower surface thereof, with a grid-shaped rib extending in the front-back direction and the left-right direction parallel or substantially parallel to extension directions of the peripheral wall portion in plan view.

According to this configuration, grid-shaped ribs extending in the front-back direction and the left-right direction are provided on the lower surface of the bottom plate portion, and the rigidity of the outer case is thus readily further increased.

In an example embodiment of the present invention, preferably a cushioning material is provided between an upper end surface of the peripheral wall portion of the case body and an inner surface of a peripheral portion of the case lid.

According to this configuration, as a result of a cushioning material for vibration isolation being provided between the upper end surface of the peripheral wall portion of the case body and the inner surface of the peripheral portion of the case lid, propagation of vibration from the case body to the case lid is readily reduced or prevented.

In an example embodiment of the present invention, preferably the substrate stopping portion fixedly supports, on an upper surface of the bottom plate portion, a peripheral portion and a vicinity of a central portion of the substrate provided with the inverter circuit.

According to this configuration, as a result of the peripheral portion and the vicinity of the center portion of the substrate being fixedly supported on the upper surface of the bottom plate portion, the substrate itself is less likely to flex, and shaking, vibration and the like are more readily reduced or prevented.

In an example embodiment of the present invention, preferably the substrate stopping portion includes a plurality of protruding pedestals to receive and fasten the substrate, and the protruding pedestals positioned adjacent to each other are connected by a coupling rib.

According to this configuration, the protruding pedestals of the substrate stopping portion are connected to each other by a coupling rib, and shaking, vibration and the like of the protruding pedestals are readily reduced or prevented.

Furthermore, an electric work vehicle according to an example embodiment of the present invention includes a battery, an electric motor to receive electric power from the battery, an inverter on a power supply path from the battery to the electric motor, and a travel device to be driven by the electric motor, the inverter including an exterior case housing a substrate provided with an inverter circuit, the exterior case including a rectangular or substantially rectangular box-shaped case body open at an upper end thereof, and a case lid operable to open and close the open upper end, the case body and the case lid being coupled together, and the case lid being provided, on a lower peripheral portion thereof, with a lip portion located on an outer side of an upper end portion of the case body and lower than the upper end portion.

According to an example embodiment of the present invention, a lip portion located on the outer side of the upper end portion of the case body and lower than the upper end portion of the case body is provided on a lower peripheral portion of the case lid operable to open and close the open upper end of the case body. Accordingly, the open upper end of the case body can be closed, with the outer side of the contact point between the case body and the case lid surrounded by the lip portion, compared to a structure in which the case body and the case lid are merely coupled together by coupling bolts.

Exposure of the contact point between the case body and the case lid to the outside can thereby be avoided, and ingress of dust, rainwater, and the like inside the exterior case from outside is thus readily prevented.

In an example embodiment of the present invention, preferably the upper end of the case body and the case lid contact each other at a point higher than the lower peripheral portion of the case lid, and the contact point includes a gasket therein.

According to this configuration, a gasket is provided at the contact point between the upper end of the case body and the case lid, at a higher position than the lower peripheral portion of the case lid, which portion is located on the outer side the upper end portion of the case body, and thus the possibility of this gasket coming into direct contact with dust, rainwater, and the like from outside is reduced. Ingress of dust, rainwater, and the like inside of the exterior case is thereby more readily prevented.

In an example embodiment of the present invention, preferably the case lid is provided, on a portion of an outer peripheral portion thereof, with a striking protrusion protruding outward.

According to this configuration, a striking protrusion that partially protrudes outward is provided on an outer peripheral portion of the case lid, and thus, if the case lid is difficult to open due to sticking to the upper end of the case body as a result of not been opened and closed for an extended period of time, this situation is readily resolved by striking the striking protrusion from outside.

In an example embodiment of the present invention, preferably the striking protrusion protrudes horizontally outward from between bolt holes on a periphery of the outer peripheral portion of the case lid.

According to this configuration, the striking protrusion protrudes horizontally outward from between the bolt holes on the periphery of the outer peripheral portion of the case lid, and thus the force generated by the striking action works effectively on the location where the degree of adhesion is high due to being firmly tightened by the coupling bolts, and the situation where the case lid is adhered to the case body is more readily resolved.

In an example embodiment of the present invention, preferably the striking protrusion is provided with a reinforcing rib extending in a protruding direction of the striking protrusion.

According to this configuration, the striking protrusion can be reinforced with a reinforcing rib, and the force generated by the striking action is readily accurately applied to the adhesion point between the case lid and the case body.

The above and other elements, features, steps, characteristics and advantages of the present invention will become more apparent from the following detailed description of the example embodiments with reference to the attached drawings.

BRIEF DESCRIPTION OF THE DRAWINGS

FIG. 2 is an illustrative diagram showing a power transmission mechanism from a battery to travel devices, a work device, and the like.

FIG. 3 is a block diagram showing a power transmission system from a motor to travel devices and the like.

DETAILED DESCRIPTION OF THE EXAMPLE EMBODIMENTS

Figure 1:
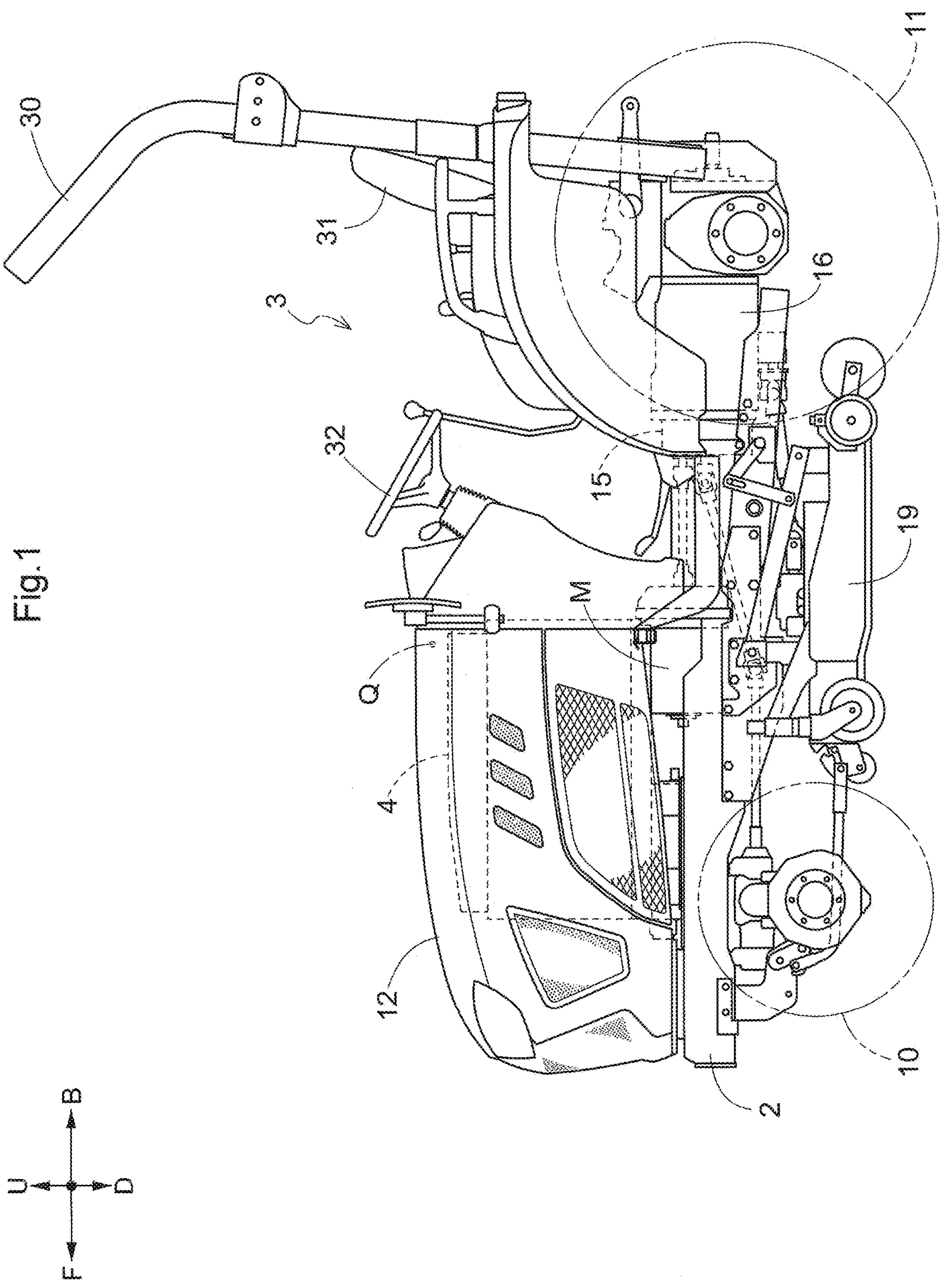
FIG. 1 is a left side view of a tractor.

Example embodiments of the present invention will be described with reference to the drawings. Note that, in the following description, unless otherwise noted, the direction of arrow F in the drawings is "forward", the direction of arrow B is "rearward", the direction of arrow L is "left", and the direction of arrow R is "right". Also, the direction of arrow U in the drawings is "up" and the direction of arrow D is "down".

Hereinafter, a tractor of the present example embodiment will be described. As shown in FIG. 1, the tractor includes left and right front wheels 10, left and right rear wheels 11, and a cover 12.

Also, the tractor includes a body frame 2 and a driving section 3. The body frame 2 is supported by the left and right front wheels 10 and the left and right rear wheels 11.

The cover 12 is disposed in a front body portion. The driving section 3 is provided behind the cover 12. In other words, the cover 12 is disposed in front of the driving section 3.

The driving section 3 has a protective frame 30, a driver's seat 31, and a steering wheel 32. An operator can sit in the driver's seat 31. The operator can thereby ride in the driving section 3. The left and right front wheels 10 are steered by operating the steering wheel 32. The operator is able to perform various driving operations in the driving section 3.

The tractor is provided with a travel battery 4. Also, the cover 12 is pivotable about an opening-closing axis Q extending the left-right direction of the body. The cover 12 is thereby openable and closable. While the cover 12 is closed, the travel battery 4 is covered by the cover 12.

Figure 2:
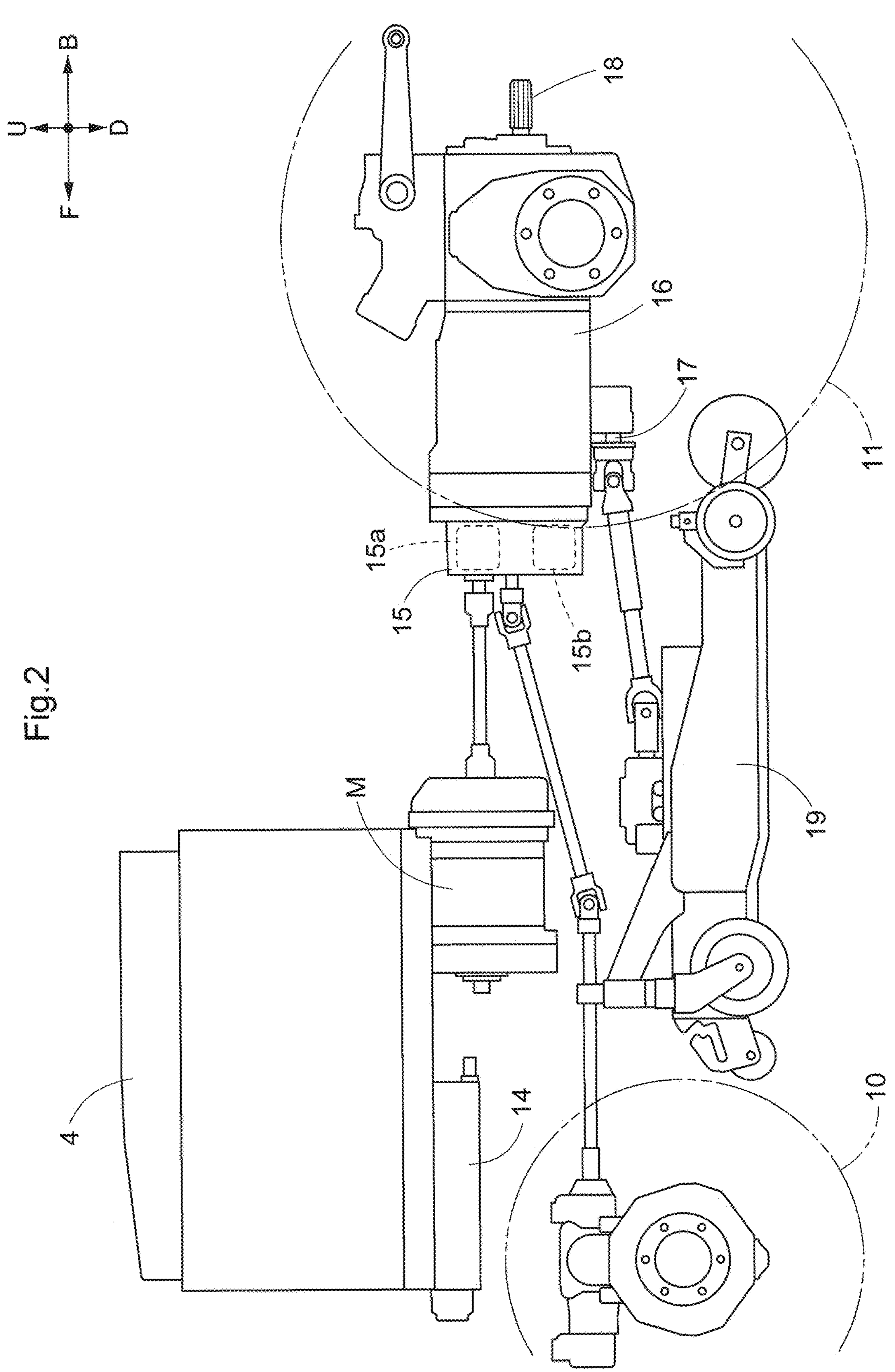

As shown in FIG. 2, the tractor includes an inverter 14 and a motor M. The travel battery 4 supplies electric power to the inverter 14. The inverter 14 converts DC power from the travel battery 4 into AC power and supplies the AC power to the motor M. The motor M is then driven by the AC power supplied from the inverter 14.

Figure 3:
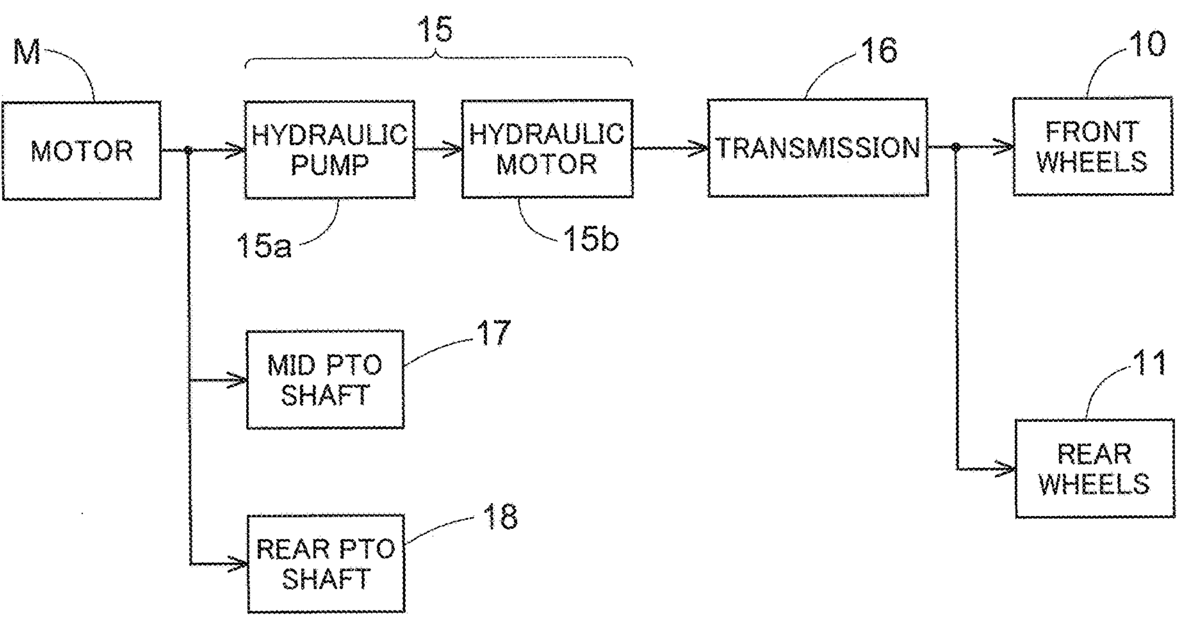

As shown in FIGS. 2 and 3, the tractor includes a hydrostatic continuously variable transmission (CVT) 15 and a transmission 16. As shown in FIG. 3, the hydrostatic CVT 15 has a hydraulic pump 15*a* and a hydraulic motor 15*b*.

The hydraulic pump 15*a* is driven by rotational power from the motor M. Rotational power is output from the hydraulic motor 15*b*, in response to the hydraulic pump 15*a* being driven. Note that, in the hydrostatic CVT 15, rotational power is varied between the hydraulic pump 15*a* and the hydraulic motor 15*b*. Also, the transmission ratio of the hydrostatic CVT 15 can be changed continuously.

The rotational power output from the hydraulic motor 15*b* is transmitted to the transmission 16. The rotational power transmitted to the transmission 16 is varied by a geared transmission mechanism of the transmission 16 and distributed to the left and right front wheels 10 and the left and right rear wheels 11. The left and right front wheels 10 and the left and right rear wheels 11 are thereby driven.

Also, as shown in FIGS. 2 and 3, the tractor includes a mid power takeoff (PTO) shaft 17 and a rear power takeoff (PTO) shaft 18. The rotational power output from the motor M is distributed to the hydraulic pump 15*a*, the mid PTO shaft 17, and the rear PTO shaft 18. The mid PTO shaft 17 and the rear PTO shaft 18 thereby rotate.

If a work device is connected to the mid PTO shaft 17 (or the rear PTO shaft 18), the work device will be driven by the rotational power of the mid PTO shaft 17 (or the rear PTO shaft 18). For example, as shown in FIG. 2, in the present example embodiment, a mowing device 19 is connected to the mid PTO shaft 17. The mowing device 19 is driven by the rotational power of the mid PTO shaft 17.

Figure 4:
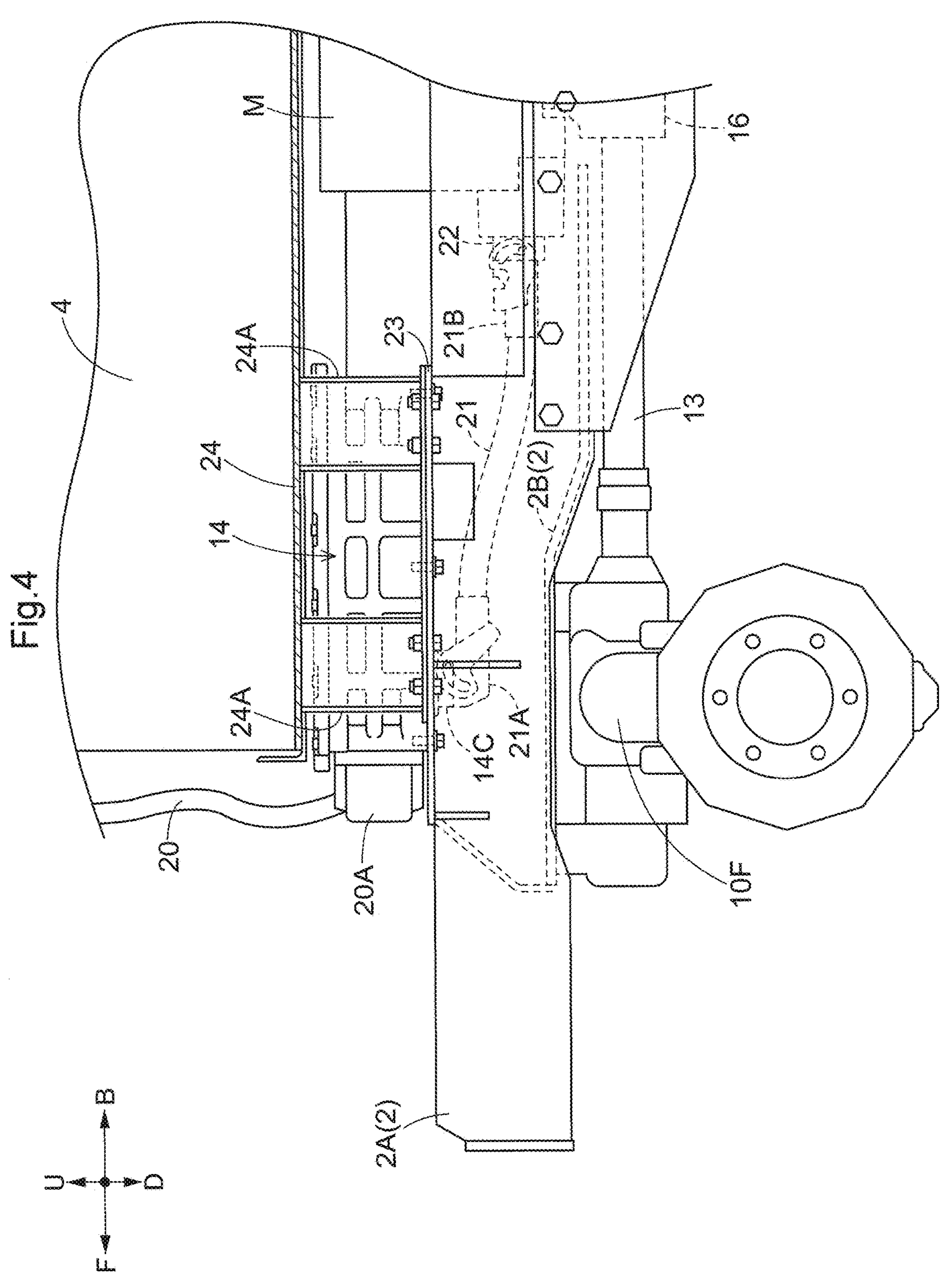
FIG. 4 is a partially cutaway side view showing an attachment point of an inverter.
Figure 5:
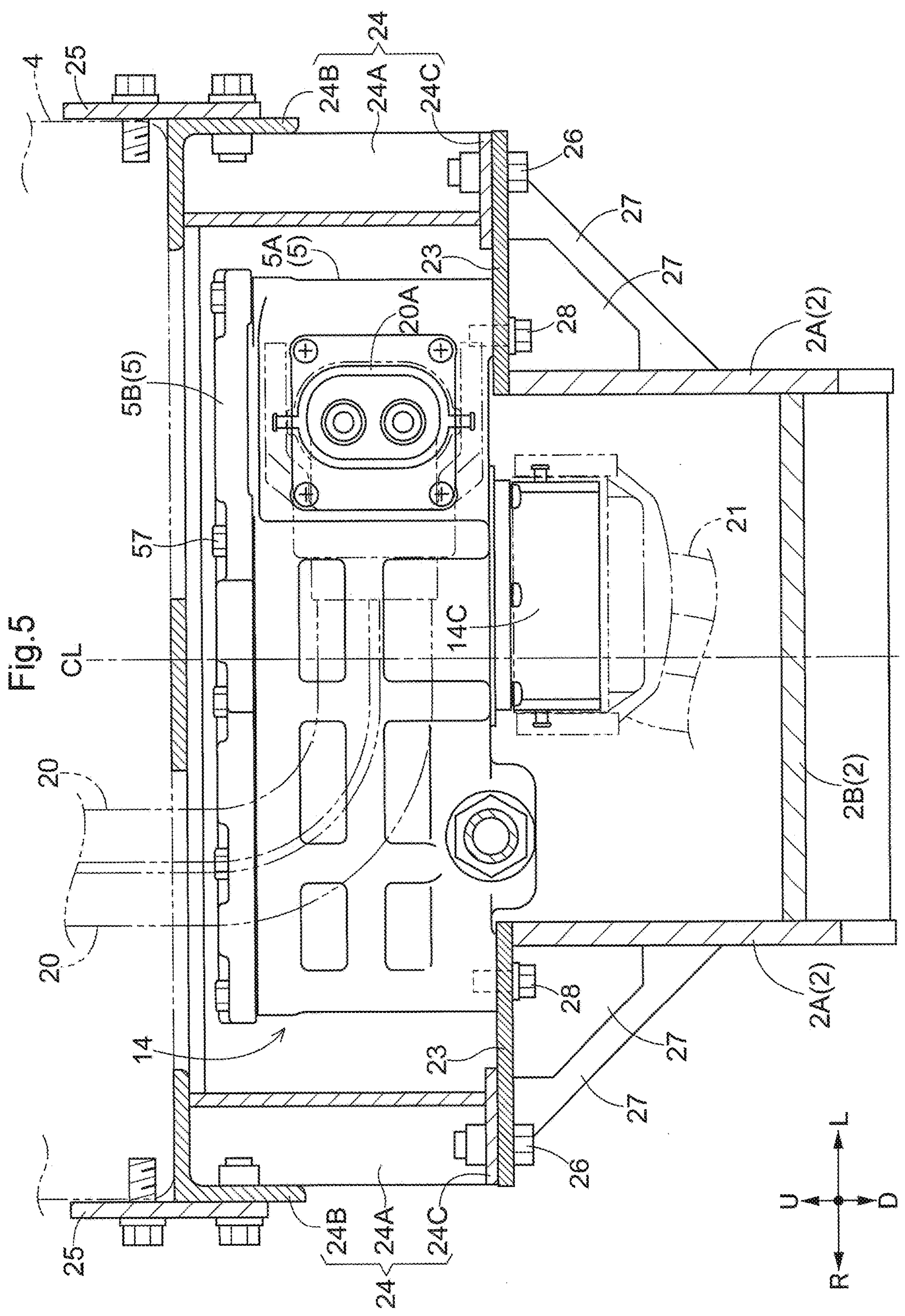
FIG. 5 is a front view showing a body frame and a battery installation base in cross-section, and showing the attachment point of the inverter.

As shown in FIGS. 4 and 5, the body frame 2 includes left and right front-back frames 2A and a lateral frame 2B. The left and right front-back frames 2A extend in the front-back direction of the body, and the lateral frame 2B joins the left and right front-back frames 2A to each other. The lateral frame 2B is coupled to lower portions of the left and right front-back frames 2A, and extends in the front-back direction in a plan view from the region where the front end portion of the inverter 14 is located to the region where the front end portion of the motor M is located.

The lateral frame 2B is coupled to an axle unit 10F extending in the left-right direction of the body of the tractor (corresponds to electric work vehicle).

The front wheels 10 are rotationally supported by left and right end portions of the axle unit 10F. Also, the transmission 16 and the axle unit 10F are coupled to a propeller shaft 13 extending in the front-back direction of the body below the lateral frame 2B.

The inverter 14 and the motor M are disposed adjacent to each other in the front-back direction. In other words, the inverter 14 and the motor M are aligned with each other in the front-back direction of the body. The motor M and the inverter 14 are supported by the left and right front-back frames 2A so as to be aligned with each other in the front-back direction of the body between the left and right front-back frames 2A. The inverter 14 is in front of the motor M.

The inverter 14 and the motor M are connected by a power supply cable 21. The power supply cable 21 is detachably connected at one end portion 21A to an output connector 14C of the inverter 14, and is detachably connected at an opposite end 21B to a power receiving connector 22 of the motor M.

The output connector 14C is located in a region of the exterior case 5 on the opposite side to the motor M. The power supply cable 21 is located above the lateral frame 2B and is housed between the left and right front-back frames 2A. That is, the power supply cable 21 extends in the front-back direction through the space surrounded by the left and right front-back frames 2A, the lateral frame 2B, and a bottom plate portion 50 of the exterior case 5. The possibility of the output connector 14C and the power supply cable 21 coming into contact with foreign objects is thereby avoided, and the possibility of the output connector 14C and the power supply cable 21 becoming detached in response to coming into contact with foreign objects can be reduced.

Figure 6:
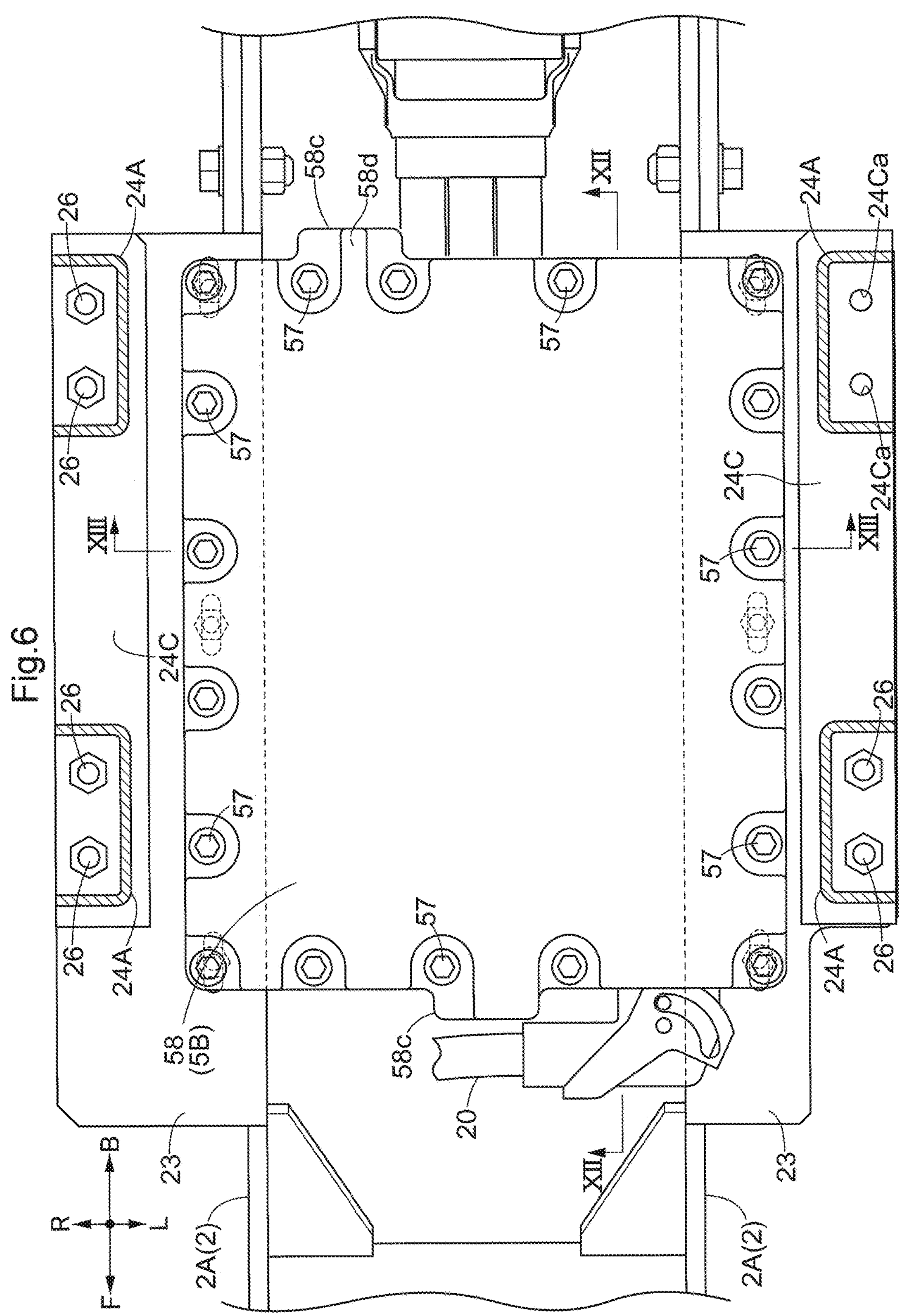
FIG. 6 is a plan view showing the battery installation base in cross-section and showing the attachment point of the inverter.

The travel battery 4 is supported by the left and right front-back frames 2A so as to be located directly above the inverter 14. Specifically, as shown in FIGS. 4 to 6, left and right support surface portions 23 are respectively provided on upper end portions of the left and right front-back frames 2A. A battery installation base 24 is provided on the left and right support surface portions 23, and the travel battery 4 is provided on the battery installation base 24.

The left and right support surface portions 23 extend in the lateral direction of the body at upper end portions of the left and right front-back frames 2A. Note that, as shown in FIGS. 4 and 5, triangular ribs 27 extend between the support surface portions 23 and the front-back frames 2A to prevent the left and right support surface portions 23 from sagging with respect to the left and right front-back frames 2A. The triangular ribs 27 are welded, at contact sides thereof, to the front-back frames 2A and the support surface portions 23, and the support surface portions 23 are thereby integrally formed with the front-back frames 2A via the triangular ribs 27, and define a portion of the body frame 2. The bottom portion of the inverter 14 is coupled to the support surface portions 23 by attachment bolts 28. The inverter 14 is thus removably supported by the body frame 2.

The battery installation base 24 is bolted to the left and right support surface portions 23. As shown in FIGS. 4 to 6, the battery installation base 24 is formed by welding together attachment plates 24C that respectively partially overlap with the left and right support surface portions 23, C-shaped steel vertical frames 24A that extends in the up-down direction on the attachment plates 24C, left and right steel angles 24B that extend in the front-back direction of the body at upper end portions of the left and right vertical frames 24A, and a lateral steel angle that joins the left and right steel angles 24B extending in the front-back direction of the body.

The attachment plates 24C have bolt insertion holes 24Ca to fix the attachment plates 24C to the support surface portions 23, and the attachment plates 24C and the support surface portions 23 can be fixedly coupled together via coupling bolts 26. The battery installation base 24 is gate shaped as viewed in the front-back direction of the body. The battery installation base 24 covers the inverter 14 from above and from the left and right sides.

Left and right side portions of upper portions of the steel angles 24B are bolted to lower portions of coupling plates 25. Also, left and right side portions of lower portions of the travel battery 4 are bolted to upper portions of the coupling plates 25. The travel battery 4 is thereby coupled to the battery installation base 24 via the coupling plates 25.

The inverter 14 of the present example embodiment will now be described with reference to FIGS. 4 to 15. The inverter 14 converts direct current from the travel battery 4 into alternating current and supplies the alternating current to the motor M.

Figure 7:
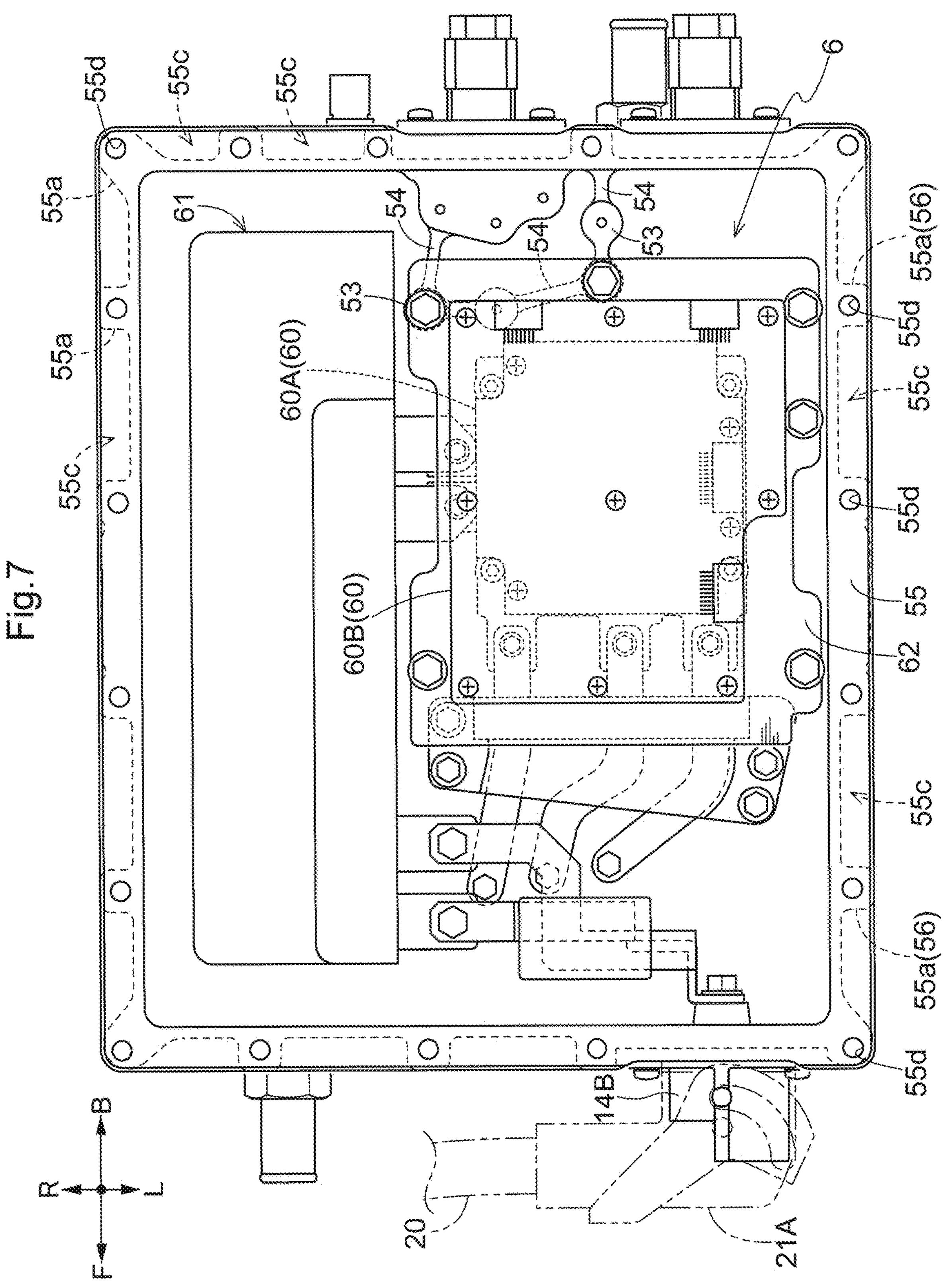
FIG. 7 is a plan view showing a case body of an exterior case of the inverter.
Figure 12:
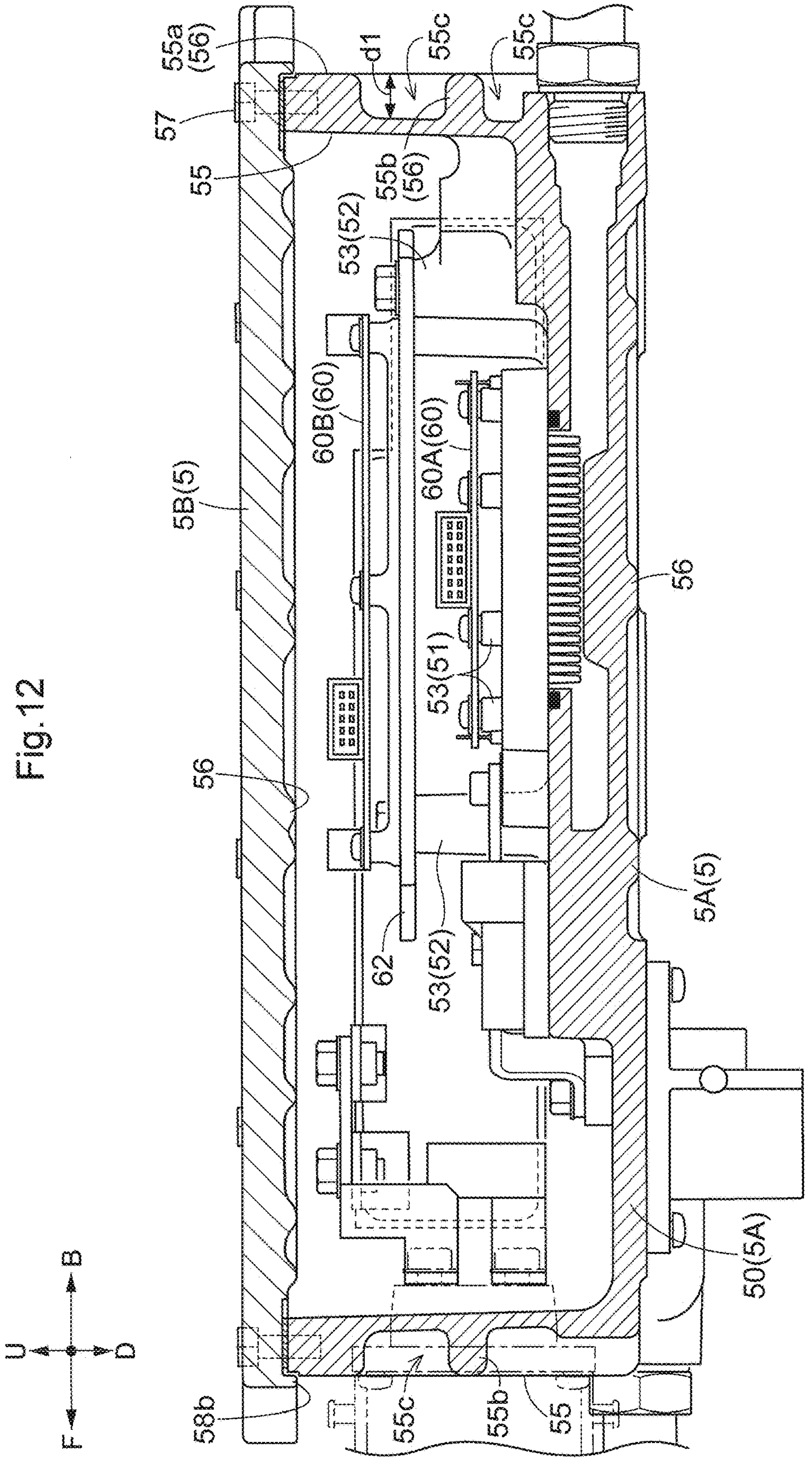
FIG. 12 is a cross-sectional view taken along line XII-XII in FIG. 6.
Figure 13:
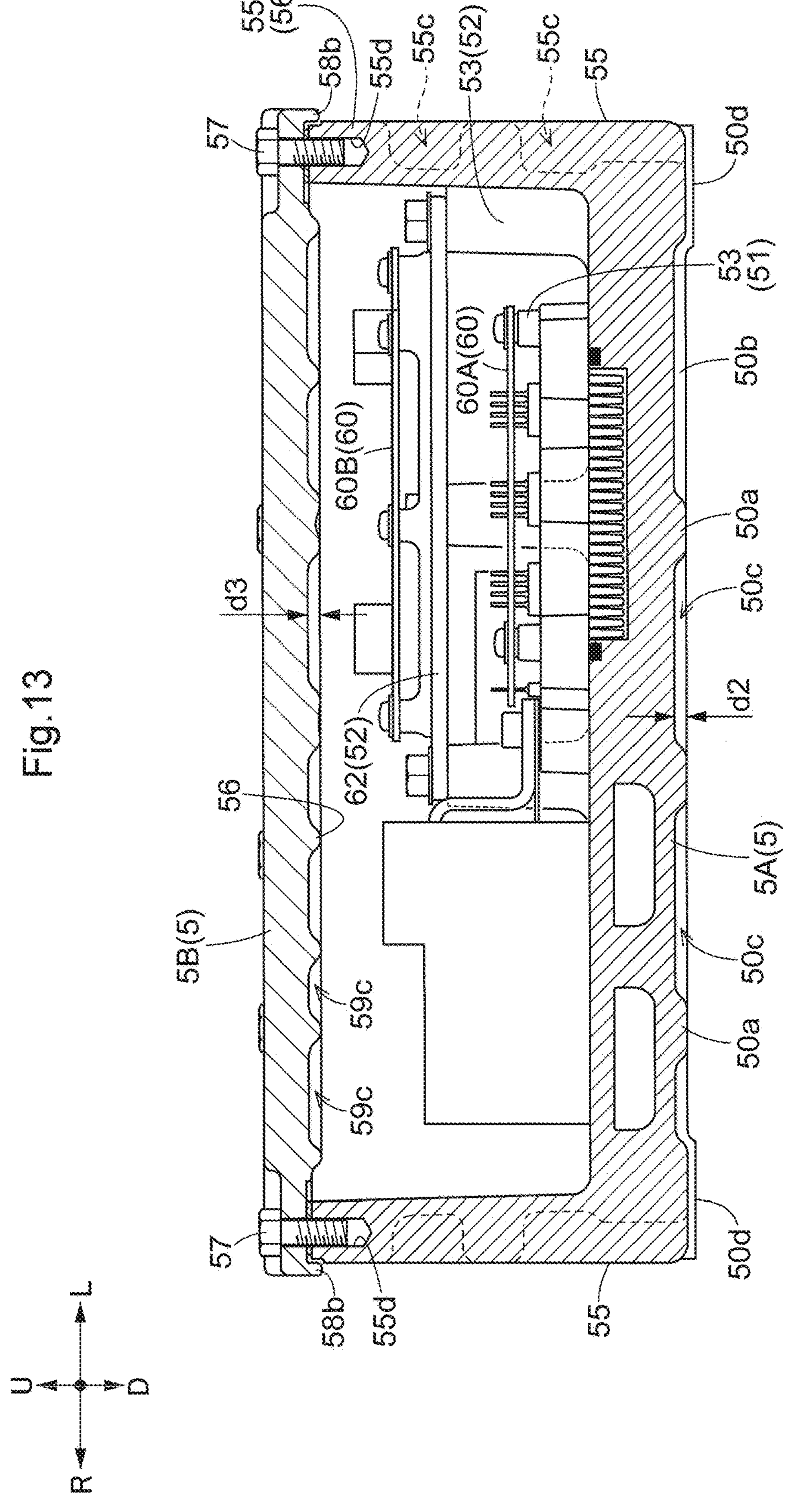
FIG. 13 is a cross-sectional view taken along line XIII-XIII in FIG. 6.

As shown in FIGS. 7, 12, and 13, the inverter 14 houses a substrate 60 on which an inverter circuit 6 is provided, a capacitor 61, and the like in the exterior case 5 which includes a case body 5A and a case lid 5B.

The inverter circuit 6 is a circuit body that converts direct current from the travel battery 4 into alternating current, and is provided with an inverter module including an insulated gate bipolar transistor (IGBT), for example, and by an inverter control module that communicates with a higher-order electronic control unit (ECU) and controls the inverter module. The capacitor 61 holds the supply voltage for the inverter module at a constant voltage.

The substrate 60 includes a first substrate 60A on which the inverter module is provided and a second substrate 60B on which the inverter control module is provided.

As shown in FIGS. 12 and 13, a first substrate stopping portion 51 is provided on the bottom plate portion 50 of the case body 5A to fix the first substrate 60A.

Also, a second substrate stopping portion 52 is provided to fix the second substrate 60B, which is a different substrate 60 from the first substrate 60A, at a position overlapping the first substrate 60A from above.

The first substrate stopping portion 51 includes protruding pedestals 53 to receive a peripheral portion and a central portion of the first substrate 60A and fixing the peripheral and central portions of the first substrate 60A to the bottom plate portion 50. The peripheral and central portions of the first substrate 60A are fixed to the bottom plate portion 50, using screw holes provided in the protruding pedestals 53 and set screws, with the protruding pedestals 53 positioned to face the peripheral and central portions of the first substrate 60A.

The second substrate stopping portion 52 includes an attachment plate 62 capable of supporting a peripheral portion and a central portion of the second substrate 60B, and protruding pedestals 53 to receive a peripheral portion of the attachment plate 62 and fixing the peripheral portion of the attachment plate 62 to the bottom plate portion 50. The peripheral and central portions of the second substrate 60B supported by the attachment plate 62 are fixed to the bottom plate portion 50, as a result of the attachment plate 62 being fixed to the bottom plate portion 50, using screw holes provided in the protruding pedestals 53 and set screws, with the protruding pedestals 53 positioned to face the peripheral portion of the attachment plate 62, while the peripheral and central portions of the second substrate 60B are supported by the attachment plate 62.

Figure 15:
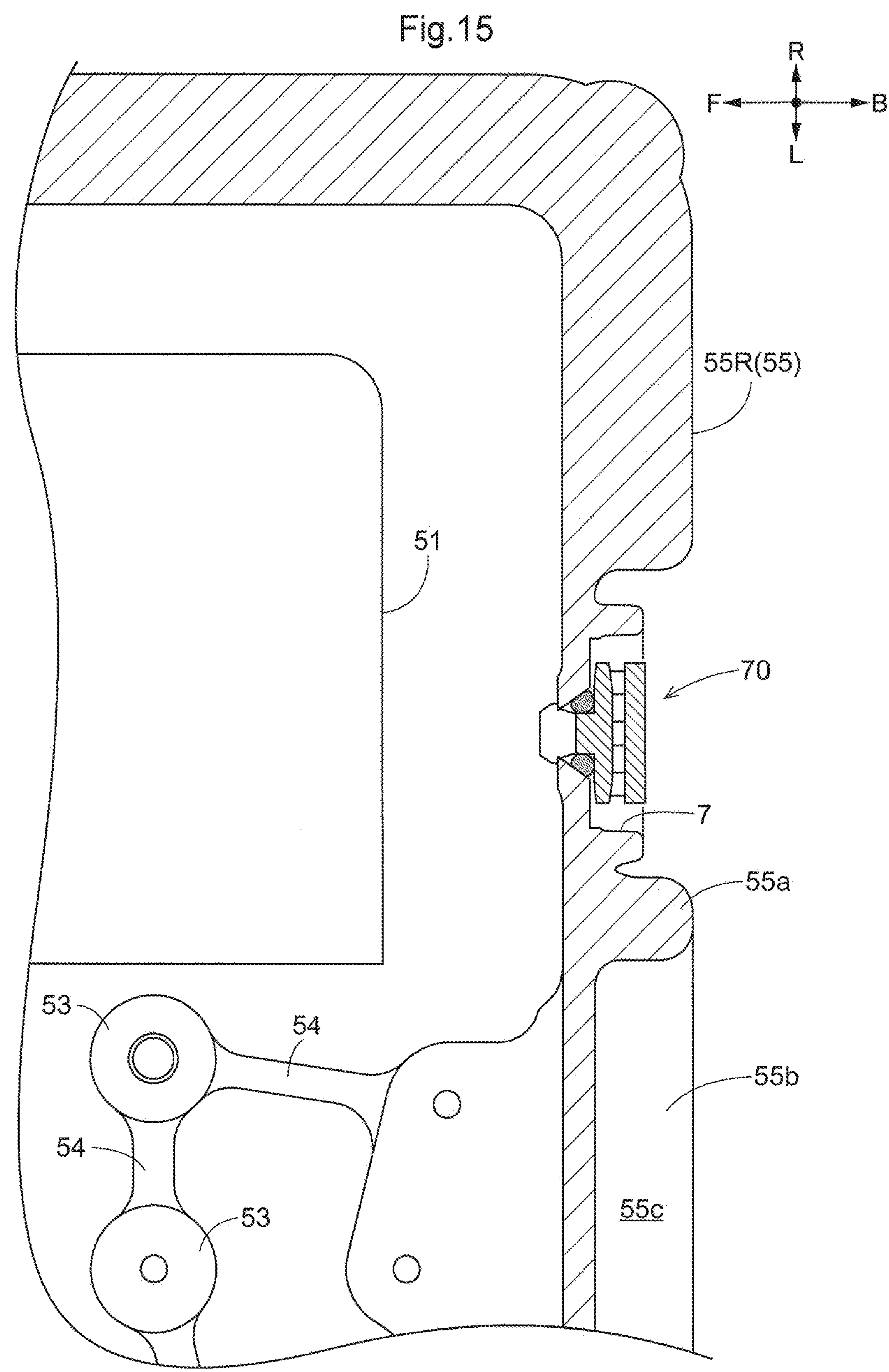
FIG. 15 is an enlarged cross-sectional view showing a breathing hole in plan view.

As shown in FIGS. 7 and 15, some of the adjacently positioned protruding pedestals 53 are connected to each other by coupling ribs 54. The protruding pedestals 53 having a high protruding height upward from the bottom plate portion 50 and are provided to fix the attachment plate 62 to the bottom plate portion 50 are connected to each other and to the inner surface of the case body 5A described later by the coupling ribs 54. Shaking of the protruding pedestals 53 having a high protruding height from the bottom plate portion 50 is thereby readily effectively reduced or prevented. As a result, transmission of shaking, vibration and the like to the attachment plate 62 and the second substrate 60B fixed to the attachment plate 62 are readily reduced or prevented.

The travel battery 4 and the inverter 14 are electrically connected to each other by a power cable 20 (corresponds to input harness). Direct current flows through the power cable 20. As shown in FIGS. 4 and 6, the inverter 14 is provided with an input connector 14B (corresponds to input connection portion). The input connector 14B protrudes forward of a front portion of the exterior case 5 and is electrically connected to a connection port 20A of the power cable 20.

In this way, the inverter 14 includes the input connector 14B electrically connected to the power cable 20, the inverter circuit 6 that converts direct current into alternating current, and the output connector 14C (output connection portion) electrically connected to the power supply cable 21 (corresponds to the output harness).

The exterior case 5 is an aluminum die-cast product that includes the case body 5A having a rectangular or substantially rectangular box shape and the case lid 5B having a rectangular or substantially rectangular plate shape.

The rectangular or substantially rectangular box-shaped case body 5A includes the bottom plate portion 50 and a peripheral wall portion 55, and the space surrounded by the bottom plate portion 50 and the peripheral wall portion 55 is open upward. The case lid 5B is capable of being coupled to and uncoupled from an upper end portion of the case body 5A, in such a manner that the opening in the case body 5A is openable and closable.

The first substrate stopping portion 51 and the second substrate stopping portion 52 to fix the substrate 60 are provided on the bottom plate portion 50 of the case body 5A. The inverter circuit 6 is housed in the exterior case 5 by closing the opening of the case body 5A with the case lid 5B, with the first substrate 60A and the second substrate 60B respectively attached to the first substrate stopping portion 51 and the second substrate stopping portion 52.

Figure 8:
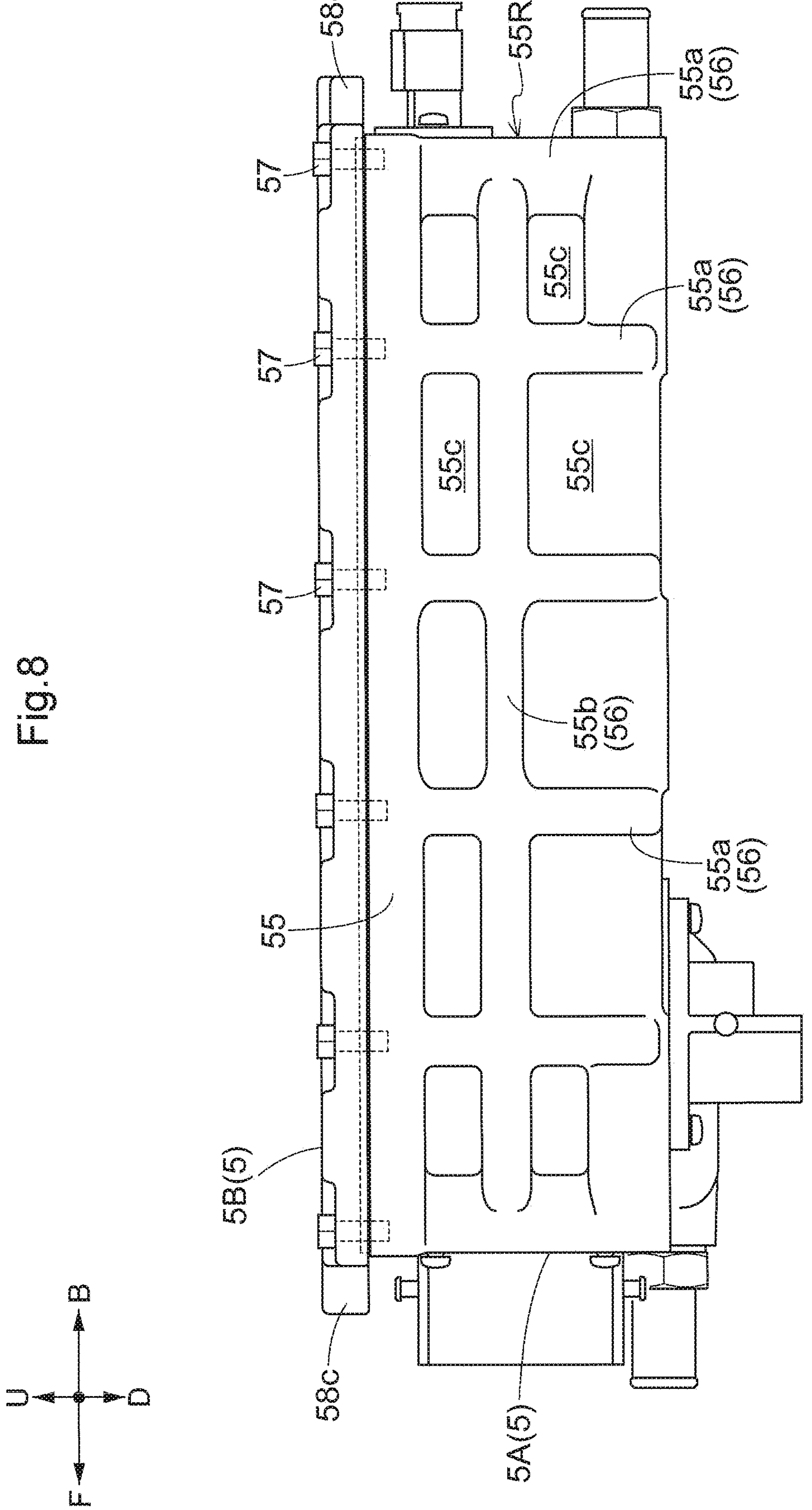
FIG. 8 is a left side view showing the exterior case.
Figure 9:
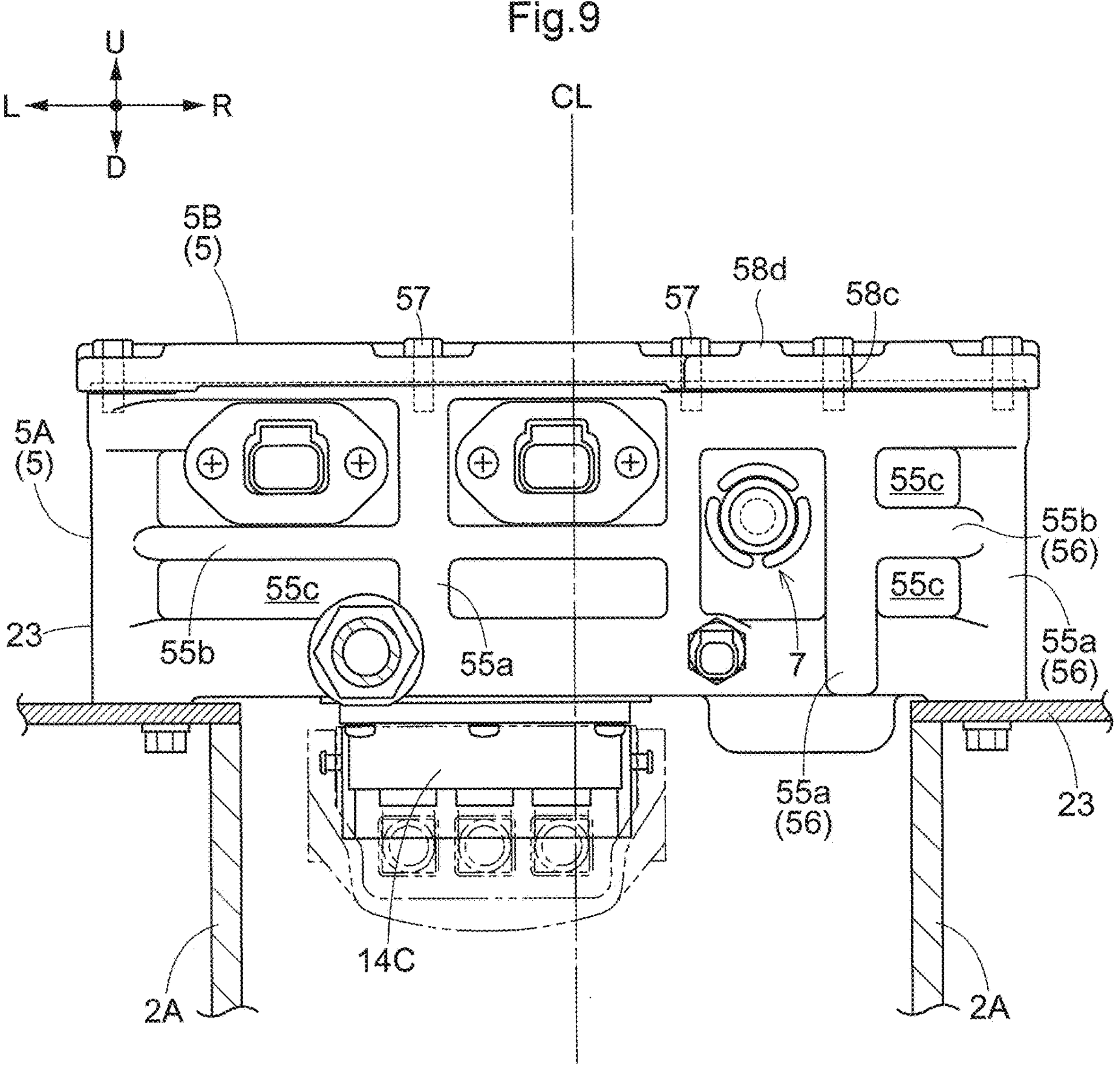
FIG. 9 is a rear view showing the exterior case.

As shown in FIGS. 8 and 9, grid-shaped reinforcing ribs 56 including vertical ribs 55*a* that extend in the up-down direction and lateral ribs 55*b* that extend in the horizontal direction, are provided on the outer wall surface of the peripheral wall portion 55 of the case body 5A.

As shown in FIG. 7, the reinforcing ribs 56 are structured such that the vertical ribs 55*a* and the lateral ribs 55*b* do not protrude outside the outer peripheral edge of the upper end of the peripheral wall portion 55. The outer wall surface between the adjacent vertical ribs 55*a* is a recessed wall surface provided, at various locations, with recessed portions 55*c* that are recessed to be closer to the inner wall surface of the case body 5A than locations of the vertical ribs 55*a*.

That is, as shown in FIGS. 7 to 9, 12, and 13, the vertical ribs 55*a* and the lateral ribs 55*b* do not protrude outward of the outer peripheral edge of the upper end of the peripheral wall portion 55, but, conversely, are the portions that remain as reinforcing ribs 56, as a result of the peripheral wall portion 55 including a portion of the outer wall surface that is recessed by providing the recessed portions 55*c*.

As shown in FIGS. 7 and 13, in an upper end portion of the peripheral wall portion 55 screw holes 55*d* into which coupling bolts 57 to fasten the case lid 5B while the case lid 5B faces the opening in the case body 5A are screwable. As shown in FIGS. 7 and 8, the screw holes 55*d* overlap with the vertical ribs 55*a* in side view.

As a result of the screw holes 55*d* being located where the vertical ribs 55*a* are provided, the strength of the locations where the case lid 5B is coupled to the case body 5A is enhanced, by effectively utilizing the locations of the vertical ribs 55*a*, which are where the peripheral wall portion 55 of the case body 5A is horizontally thick.

As shown in FIGS. 7, 12, and 13, the recess depth of the recessed portions 55*c* corresponds to a distance d1 from the outer end to the inner end of the vertical ribs 55*a*. As a result, the far inner portion of the recessed portions 55*c* is located closer to the inner wall surface of the peripheral wall portion 55 than locations of the coupling bolts 57. By thus increasing the recess depth of the recessed portion 55*c*, the wall thickness of the peripheral wall portion 55 at locations of the recessed portions 55*c* is reduced, and weight reduction of the case body 5A is achieved.

On the peripheral wall portion 55 of the case body 5A, the grid-shaped reinforcing ribs 56 are provided not only on the left side surface shown in FIG. 8 and the rear surface shown in FIG. 9, but are also similarly provided on the front surface shown in FIG. 5 and on the right side surface which is not shown.

Figure 10:
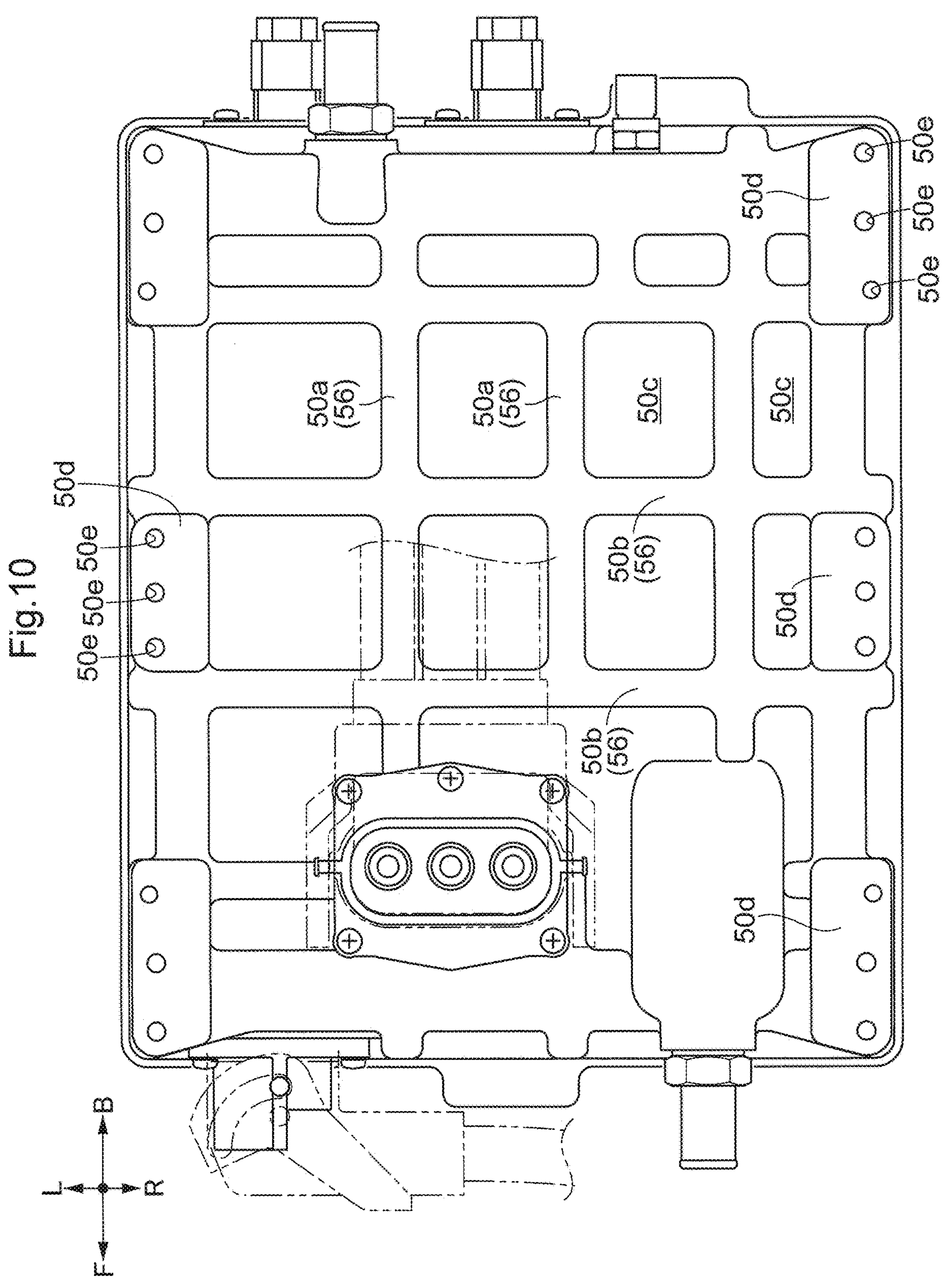
FIG. 10 is a bottom view showing the case body of the exterior case.

As shown in FIG. 10, reinforcing ribs 56 including front-rear ribs 50*a* extending in the front-back direction and left-right ribs 50*b* extending in the left-right direction are provided on the lower surface of the bottom plate portion 50 of the case body 5A.

At both left and right end portions of the bottom plate portion 50, attachment seats 50*d* are provided to fix the case body 5A to the support surface portions 23 of the front-back frames 2A. These attachment seats 50*d* are provided with attachment holes 50*e* to fix via the attachment bolt 28.

The front-rear ribs 50*a* and the left-right ribs 50*b* are also formed by providing upward-facing recessed portions 50*c* in an area surrounded by the front-rear ribs 50*a* and the left-right ribs 50*b*, rather than protruding lower than the lower surface of the attachment seat 50*d* at the lower end of the outer peripheral edge of the bottom plate portion 50.

The recess depth of the upward-facing recessed portion 50*c* corresponds to a distance d2 from the lower end to the upper end of the front-rear ribs 50*a* and the left-right ribs 50*b*. The recessed portions 50*c* are shallower than the recessed portions 55*c*, by making this distance d2 shorter than the distance d1 (see FIG. 13) corresponding to the recess depth of the recessed portions 55*c* in the peripheral wall portion 55 described above.

The peripheral wall portion 55 of the case body 5A includes a rear-facing wall portion 55R that faces the rearward side of the body and is provided with a breathing hole 7 for ventilation through which air inside the exterior case 5 can be exhausted.

This breathing hole 7 is provided with a filter 70 to allow internal air to be exhausted following a rise in air pressure within the exterior case 5 due to factors such as heat generated by the inverter circuit 6, and to restrict ingress of dust, rainwater, and the like from outside.

As shown in FIGS. 5 and 9, the exterior case 5 is installed on the front-back frames 2A so as to be allocated on the left and right of a vertical line CL that passes through a central position between the left and right front-back frames 2A in the left-right direction, that is, a central position in the left-right direction of the body. The vertical line CL intersects an axis (not shown) of the axle unit 10F of the front wheels 10 that extends in the front-back direction as viewed in the front-back direction of the body. Accordingly, the exterior case 5 is installed on the front-back frames 2A in the vicinity of the location where shake of the front-back frames 2A in the left-right direction when the front wheels 10 are rolling about the axis extending in the front-back direction is minimal.

As shown in FIGS. 4 and 5, the travel battery 4 is located above the exterior case 5, and the exterior case 5 is covered by the travel battery 4 and the battery installation base 24 to install the travel battery 4. The lateral frame 2B that joins the left and right front-back frames 2A and the support surface portions 23 provided on the upper edge of the front-back frames 2A are located below the exterior case 5. The lower side of the exterior case 5 is thereby blocked by the left-right lateral frame 2B and the support surface portions 23.

Even though the vertical frames 24A of the battery installation base 24 are provided laterally outward of the exterior case 5, large portions of the exterior case 5 are exposed laterally outward.

The breathing hole 7 provided in the rear-facing wall portion 55R is located between the left and right front-back frames 2A in the left-right direction. Furthermore, as shown in FIG. 9, the breathing hole 7 is located between the vertical line CL and the front-back frame 2A on the right side.

The case lid 5B is capable of being coupled to and uncoupled from the upper end portion of the case body 5A and has the following structure.

Figure 11:
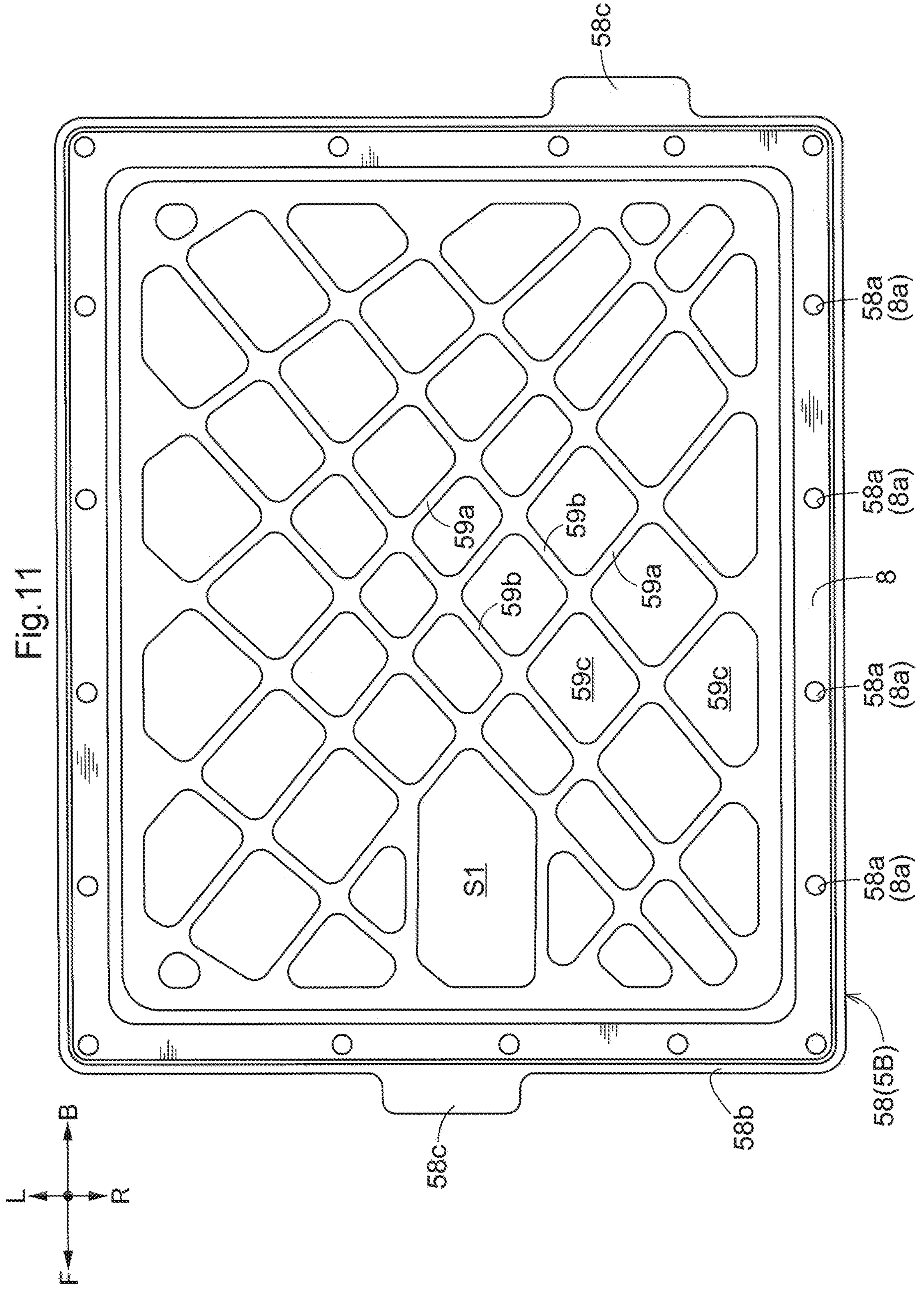
FIG. 11 is a bottom view showing a case lid of the exterior case.

As shown in FIG. 11, the case lid 5B has a large number of bolt insertion holes 58*a* (correspond to coupling holes) in a peripheral portion of the rectangular plate-shaped lid plate 58. The coupling bolts 57 are inserted into these bolt insertion holes 58*a* and a large number of screw holes 55*d* formed at the upper end portion of the peripheral wall portion 55 of the case body 5A, and the case lid 5B can be fastened with the case lid 5B facing the opening of the case body 5A.

As shown in FIGS. 11 to 14, a rib-shaped lip portion 58*b* that protrudes downward along the outer edge of the lid plate 58 is provided on the outer peripheral end portion of the lid plate 58.

In this lip portion 58*b*, the lengths of the inner peripheral surface of the lip portion 58*b* in the front-back direction and the left-right direction are slightly larger than the lengths of the outer peripheral surface of the upper end portion of the peripheral wall portion 55 in the front-back direction and the left-right direction, such that the lip portion 58*b* externally fits to the upper end portion of the peripheral wall portion 55.

Figure 14:
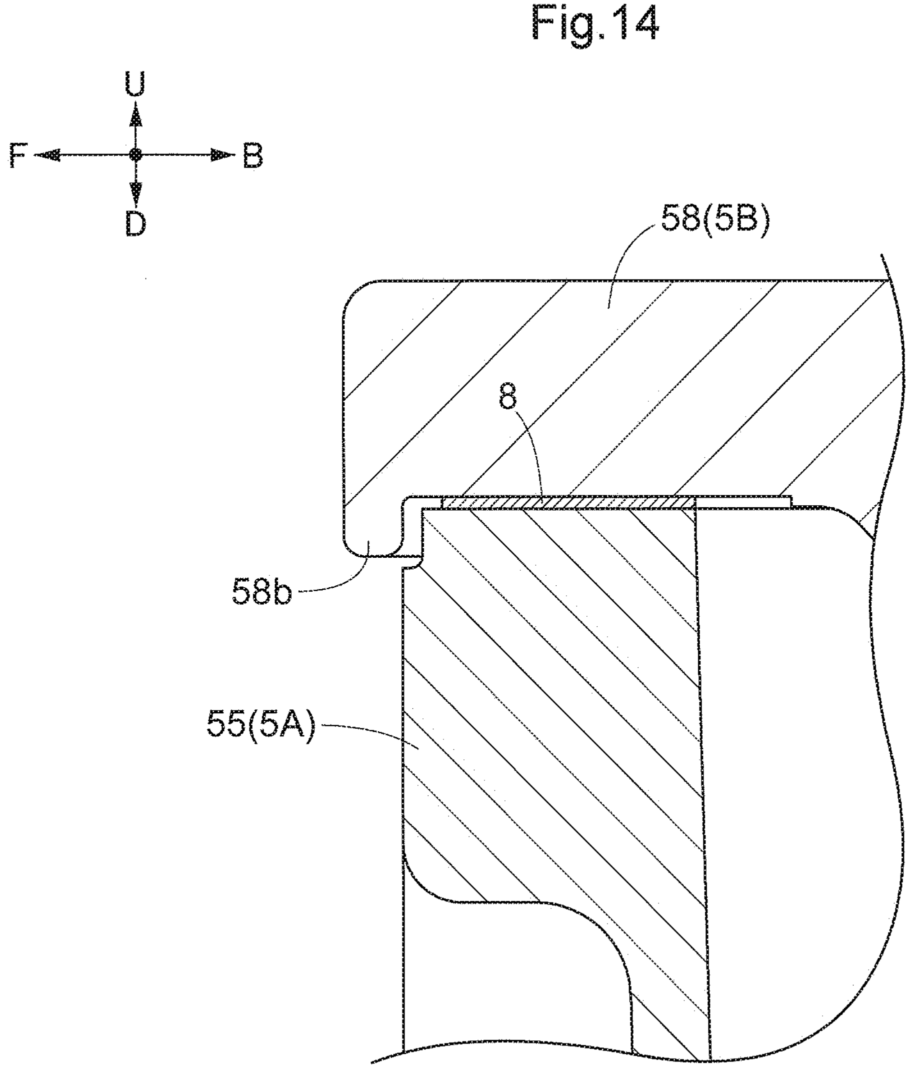
FIG. 14 is an enlarged cross-sectional view showing a lip portion of the case lid in vertical cross-section.

As a result, as shown in FIGS. 12 to 14, with the lid plate 58 placed on the upper side of the peripheral wall portion 55 of the case body 5A, the lip portion 58*b* fits together with the upper end of the peripheral wall portion 55 to partially overlap in the up-down direction. While the case lid 5B is thus externally fitted to the peripheral wall portion 55 of the case body 5A, the contact point between the upper end of the peripheral wall portion 55 of the case body 5A and the lower surface of the case lid 5B at a position facing the upper end thereof is higher than the lower end of the lip portion 58*b* corresponding to the lower peripheral portion of the case lid 5B.

By inserting the coupling bolts 57 into the bolt insertion holes 58*a* in the lid plate 58 and the screw holes 55*d* in the peripheral wall portion 55 and tightening the coupling bolts 57 in the above state, the case lid 5B is fixed so as to be externally fitted to the upper end portion of the peripheral wall portion 55 of the case body 5A.

As shown in FIGS. 11 and 14, a resin gasket 8 as a sealing material that doubles as a cushioning material is provided between the upper end of the peripheral wall portion 55 of the case body 5A and the outer peripheral end portion on the inner side of the lip portion 58*b* of the lid plate 58.

As described above, the contact point between the upper end of the peripheral wall portion 55 of the case body 5A and the lower surface of the case lid 5B at a position facing the upper end of the peripheral wall portion 55 is higher than the lower end of the lip portion 58*b* corresponding to the lower peripheral portion of the case lid 5B, and thus the position of the gasket 8 located in that region is also higher than the lower end of the lip portion 58*b* corresponding to the lower peripheral portion of the case lid 5B.

As shown in FIG. 11, through holes 8*a* are formed in the gasket 8 through which the coupling bolts 57 can be inserted, at the same position as the bolt insertion hole 58*a* of the lid plate 58. Once fixing with the coupling bolts 57 is performed with the gasket 8 between the upper end of the peripheral wall portion 55 and the outer peripheral end portion on the inner side of the lip portion 58*b* of the lid plate 58, dust, rainwater, and the like entering the exterior case 5 from outside is readily reliably reduced or prevented as a result of the multiplier effect of suppressing entry of dust, rainwater, and the like as a result of the presence of the lip portion 58*b* and the sealing effect of the gasket 8.

The gasket 8 is also effective in reducing or preventing propagation of vibration from the case body 5A to the case lid 5B, and, conversely, propagation of vibration from the case lid 5B to the case body 5A.

As shown in FIG. 6, the upper surface of the lid plate 58 that defines the case lid 5B is almost completely flat except for the periphery of the bolt insertion holes 58*a*, and a surface on which a large number of reinforcing ribs 56 are provided defines the lower surface of the lid plate 58, as shown in FIG. 11. The reinforcing ribs 56 are diagonal grid-shaped ribs 59*a* and 59*b* of the lid plate 58 that extend diagonally.

In FIG. 11, the portion surrounded by the diagonal grid-shaped ribs 59*a* and 59*b* is an upward-facing recessed portion 59*c* that is recessed toward the upper surface of the case lid 5B.

That is, as shown in FIGS. 12 and 13, the lower surface of the lid plate 58 located between the diagonal grid-shaped ribs 59*a* and 59*b* does not protrude lower than the lower end of the lip portion 58*b*, but, conversely, is a recessed wall surface including at various locations the recessed portions 59*c* that are recessed to approach the upper surface of the lid plate 58. The diagonal grid-shaped ribs 59*a* and 59*b* are thus the portions that remain as reinforcing ribs 56, as a result of a portion of the lower surface of the lid plate 58 being recessed by providing the recessed portions 59*c*.

The recess depth of the upward-facing recessed portion 59*c* corresponds to a distance d3 from the lower end to the upper end of the diagonal grid-shaped ribs 59*a* and 59*b*. The recessed portions 50*c* are shallower than the recessed portions 55*c*, by making this distance d3 shorter than the distance d1 (see FIG. 13) corresponding to the recess depth of the recessed portions 55*c* in the peripheral wall portion 55 described above.

The diagonal grid-shaped ribs 59*a* and 59*b* extend in directions joining the bolt insertion holes 58*a* in the rectangular or substantially rectangular peripheral portion of the case lid 5B.

As shown in FIG. 11, a portion of the lower surface of the case lid 5B (inner surface of exterior case 5) has a region S1 in which the diagonal grid-shaped ribs 59*a* and 59*b* protruding toward the inner space of the exterior case 5 are not provided.

In this region S1, the diagonal grid-shaped ribs 59*a* and 59*b* extending in directions joining the bolt insertion holes 58*a* are interrupted partway between one bolt insertion hole 58*a* and another bolt insertion hole 58*a*. In this region S1, as a result of there being no diagonal grid-shaped ribs 59*a* and 59*b*, the far inner surface (lower surface of case lid 5B) of the region S1 will be closer to the upper surface of the case lid 5B by the protruding height of the diagonal grid-shaped ribs 59*a* and 59*b*, and about the same position as the recess depth of the recessed portion 59*c*.

This region S1 defines an insulation distance securing space to allow a distance for insulating purposes to be secured between the case lid 5B and components attached to the case body 5A at locations facing the region S1.

The case lid 5B is integrally molded with striking protrusions 58*c* that protrude outward from a portion of the outer peripheral portion of the lid plate 58.

The striking protrusions 58*c* protrude horizontally outward from between the bolt insertion holes 58*a* (corresponds to bolt holes) on the periphery of the outer peripheral portion of the lid plate 58. The striking protrusions 58*c* also include ribs 58*d* (correspond to reinforcing ribs 56) that extend in the protruding direction of the striking protrusions 58*c* (see FIGS. 6 and 9).

When the case lid 5B is firmly coupled to the case body 5A by tightening down the coupling bolts 57 and is not opened or closed for an extended period of time, the case lid 5B may be difficult to open even when the coupling bolts 57 are removed, due to becoming stuck to the upper end of the case body 5A.

At this time, by striking the striking protrusions 58*c* from outside, the adhesion between the case lid 5B and the case body 5A is released, and the case lid 5B is readily opened. When the striking protrusions 58*c* are struck from outside, there is also a possibility of the striking protrusions 58*c* being slightly deformed or damaged depending on the extent of the strike, due to being aluminum die-cast products, but there is little risk of the case lid 5B portion, which is the main component of the exterior case 5 apart from the striking protrusions 58*c*, being deformed or damaged.

Also, in order to effectively exhibit the action of releasing the adhesion to the case lid 5B by striking the striking protrusions 58*c* from outside, the location where the case lid 5B and the upper end of the peripheral wall portion 55 fit together may be as follows. That is, it is desirable that, between the inner peripheral surface of the lip portion 58*b* on the outer peripheral portion of the case lid 5B and the outer peripheral surface of the upper end portion of the peripheral wall portion 55, the inner peripheral surface of the lip portion 58*b* has a size enabling separation from the outer peripheral surface of the upper end portion of the peripheral wall portion 55, such that there at least is a slight horizontal gap, as shown in FIGS. 12 to 14.

Other Example Embodiments

Hereinafter, other example embodiments will be described. The following example embodiments may be used in combination as long as no there are no inconsistencies. Note that the scope of the present invention is not limited to the contents of these example embodiments.

(1) In the examples illustrated in the above-described example embodiments, the exterior case 5 is an aluminum die-cast product, but need not necessarily be an aluminum die-cast product, and may, for example, be a cast iron product or may be made of another material.

The remaining configuration can be similar to the above-described example embodiments.

(2) In the examples illustrated in the above-described example embodiments, two substrates 60 are housed in the exterior case 5 as the inverter circuit 6, but the number of substrates 60 is not limited to two, and may be only one or may be three or more.

The remaining configuration can be similar to the above-described example embodiments.

(3) In the examples illustrated in the above-described example embodiments, the exterior case 5 includes a rectangular box-shaped case body 5A and a rectangular plate-shaped case lid 5B, but the exterior case 5 is not limited to being rectangular, and may be other shapes.

The remaining configuration can be similar to the above-described example embodiments.

(4) In the examples illustrated in the above-described example embodiments, the grid-shaped reinforcing ribs 56 are provided on the entirety of the peripheral wall portion 55 and the bottom plate portion 50 of the case body 5A, but are not limited to this structure, and the reinforcing ribs 56 may be provided on only part of the peripheral wall portion 55 and the bottom plate portion 50 of the case body 5A.

The remaining configuration can be similar to the above-described example embodiments.

(5) In the examples illustrated in the above-described example embodiments, the grid-shaped reinforcing ribs 56 are similarly provided on the entirety of the peripheral wall portion 55 and the bottom plate portion 50 of the case body 5A, but are not necessarily limited to this structure, and the reinforcing ribs 56 may be provided in an appropriate combination, such as the vertical rib 55*a* being provided on the left and right peripheral wall portions 55, the lateral rib 55*b* being provided on the front and rear peripheral wall portions 55, and the front-rear rib 50*a* being provided on the lower surface of the bottom plate portion 50.

Also, the extension direction of the reinforcing ribs 56 is not limited to up/down, horizontal, front/back and left/right, and may be set as appropriate, such as diagonally or in any direction.

The remaining configuration can be similar to the above-described example embodiments.

(6) In the examples illustrated in the above-described example embodiments, the reinforcing ribs 56 are provided by forming the recessed portions 55*c* in the recess direction from a wall surface serving as a reference such as the outer peripheral edge of the upper end of the peripheral wall portion 55, but are not necessarily limited to this structure. For example, reinforcing ribs 56 that protrude laterally outward from a reference wall surface such as the outer peripheral edge of the upper end of the peripheral wall portion 55 may be provided.

Also, the wall surface of the exterior case 5 may include a portion on which the reinforcing ribs 56 are not provided.

The remaining configuration can be similar to the above-described example embodiments.

(7) In the examples illustrated in the above-described example embodiments, the diagonal grid-shaped ribs 59*a* and 59*b* extending in diagonal directions of the lid plate 58 are provided as reinforcing ribs 56 provided on the lower surface of the lid plate 58, but the reinforcing ribs 56 are not necessarily limited to this structure. For example, grid-shaped reinforcing ribs 56 in which the front-back direction and the left-right direction intersect along the periphery of the lid plate 58 instead of the diagonal directions may be provided. Also, instead of grid-shaped reinforcing ribs 56, diagonal reinforcing ribs 56 that extend along diagonal directions of the lid plate 58, longitudinal reinforcing ribs 56 that extend along the periphery of the lid plate 58, or lateral reinforcing ribs 56 that extend along the periphery of the lid plate 58 may be provided.

The remaining configuration can be similar to the above-described example embodiments.

(8) In the examples illustrated in the above-described example embodiments, the reinforcing ribs 56 are provided only on the lower surface of the lid plate 58, but are not necessarily limited to this structure. Reinforcing ribs 56 having an appropriate structure can be used, such as reinforcing ribs 56 provided only on the upper surface of the lid plate 58, or reinforcing ribs 56 provided on both the lower and upper surfaces of the lid plate 58.

The remaining configuration can be similar to the above-described example embodiments.

(9) In the examples illustrated in the above-described example embodiments, the plurality of protruding pedestals 53 used as substrate stopping portions include protruding pedestals 53 having a high protruding height upward that are joined together by coupling ribs 54, but this structure need not necessarily be used, and, for example, protruding pedestals 53 having a low protruding height may be coupled together, or low and high protruding pedestals 53 may be joined together.

The remaining configuration can be similar to the above-described example embodiments.

(10) In the examples illustrated in the above-described example embodiments, the lip portion 58*b* protrudes downward from the periphery of the lid plate 58 by a constant amount, but is not necessarily limited to this structure, and the lip portion may protrude downward longer or shorter in locations on the periphery of the lid plate 58. In this case, the amount of downward protrusion may be lengthened in locations that are predicted to often be exposed to dust or rainwater from outside, such as increasing the amount of downward protrusion on the front side of the body, for example.

The remaining configuration can be similar to the above-described example embodiments.

(11) In the example illustrated in the above-described example embodiments, the lip portion 58*b* protrudes downward from the entire periphery of the lid plate 58, but is not necessarily limited to this structure, and there may be locations on the periphery of the lid plate 58 where the lip portion 58*b* is not provided.

The remaining configuration can be similar to the above-described example embodiments.

Example embodiments of the present invention can be utilized not only for tractors but also for various electric work vehicles such as combine harvesters, rice transplanters, and construction work machines.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electric work vehicle comprising:

a battery;

an electric motor to receive electric power from the battery; and an inverter on a power supply path from the battery to the electric motor, the inverter including an exterior case housing a substrate provided with an inverter circuit;

the exterior case including:

a rectangular or substantially rectangular box-shaped case body provided with an opening above a space surrounded by a bottom plate portion and a peripheral wall portion of the case body; and a case lid operable to open and close the opening;

the bottom plate portion being provided on an upper surface thereof, with a substrate stopping portion to fix the substrate; and the case body being provided with at least one reinforcing rib on an outer surface of the peripheral wall portion, and the case lid being provided with at least one reinforcing rib on an inner surface thereof, wherein the at least one reinforcing rib on the peripheral wall portion is at least one vertical rib extending in an up-down direction, and the at least one reinforcing rib on the inner surface of the case lid is at least one diagonal grid-shaped rib extending in a diagonal direction of the case lid.

2. The electric work vehicle according to claim 1, wherein the at least one vertical rib does not protrude outside an outer peripheral edge of an upper end of the peripheral wall portion; and the peripheral wall portion includes an outer wall surface between the vertical ribs positioned adjacent to each other and being a recessed wall surface recessed to be closer to an inner wall surface of the case body than a location of the vertical ribs.

3. The electric work vehicle according to claim 1, wherein the at least one vertical rib overlaps, in a side view, with a screw hole in the peripheral wall portion to fasten the case lid to the case body.

4. The electric work vehicle according to claim 1, wherein the at least one diagonal grid-shaped rib extends in a direction joining coupling holes for bolt insertion in a rectangular or substantially rectangular peripheral portion of the case lid.

5. The electric work vehicle according to claim 1, wherein the inner surface of the case lid includes a region in which a portion of the at least one diagonal grid-shaped rib protruding into the space does not exist, and between the case lid and a component attached to the case body at a location facing the region is a space to provide an insulation distance.

6. The electric work vehicle according to claim 1, wherein a cushioning material is between an upper end surface of the peripheral wall portion of the case body and an inner surface of a peripheral portion of the case lid.

7. The electric work vehicle according to claim 1, wherein the substrate stopping portion fixedly supports, on an upper surface of the bottom plate portion, a peripheral portion and a vicinity of a central portion of the substrate provided with the inverter circuit.

8. The electric work vehicle according to claim 1, wherein the substrate stopping portion includes a plurality of protruding pedestals to receive and fasten the substrate; and the protruding pedestals positioned adjacent to each other are connected by a coupling rib.

9. An electric work vehicle comprising:

a battery;

an electric motor to receive electric power from the battery; and an inverter on a power supply path from the battery to the electric motor;

the inverter including an exterior case housing a substrate provided with an inverter circuit;

the exterior case including:

a rectangular or substantially rectangular box-shaped case body provided with an opening above a space surrounded by a bottom plate portion and a peripheral wall portion of the case body; and a case lid operable to open and close the opening;

the bottom plate portion being provided on an upper surface thereof, with a substrate stopping portion to fix the substrate; and the case body being provided with at least one reinforcing rib on an outer surface of the peripheral wall portion, and the case lid being provided with at least one reinforcing rib on an inner surface thereof, wherein the bottom plate portion is provided, on a lower surface thereof, with a grid-shaped rib extending in the front-back direction and the left-right direction parallel or substantially parallel to extension directions of the peripheral wall portion in a plan view.

10. An electric work vehicle comprising:

a battery;

an electric motor to receive electric power from the battery; and an inverter on a power supply path from the battery to the electric motor, the inverter including an exterior case housing a substrate provided with an inverter circuit;

the exterior case including:

a rectangular or substantially rectangular box-shaped case body open at an upper end thereof; and a case lid operable to open and close the open upper end;

the case body and the case lid being coupled together; and the case lid being provided, on a lower peripheral portion thereof, with a lip portion located on an outer side of an upper end portion of the case body and lower than the upper end portion, wherein the case lid is provided, on a portion of an outer peripheral portion thereof, with a striking protrusion protruding outward.

11. The electric work vehicle according to claim 10, wherein the upper end of the case body and the case lid contact each other at a point higher than the lower peripheral portion of the case lid; and the contact point includes a gasket therein.

12. The electric work vehicle according to claim 10, wherein the striking protrusion protrudes horizontally outward from between bolt holes on a periphery of the outer peripheral portion of the case lid.

13. The electric work vehicle according to claim 10, wherein the striking protrusion is provided with a reinforcing rib extending in a protruding direction of the striking protrusion.

* * * * *